United States Patent
Jang et al.

(10) Patent No.: US 8,718,225 B2
(45) Date of Patent: May 6, 2014

(54) SHIFT REGISTER

(71) Applicant: LG Display Co., Ltd., Seoul (KR)

(72) Inventors: Yong-Ho Jang, Goyang-si (KR);
Seung-Chan Choi, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/960,534

(22) Filed: Aug. 6, 2013

(65) Prior Publication Data

US 2013/0322593 A1  Dec. 5, 2013

Related U.S. Application Data

(62) Division of application No. 13/338,022, filed on Dec. 27, 2011, now Pat. No. 8,526,569.

(30) Foreign Application Priority Data

Apr. 21, 2011 (KR) .................. 10-2011-0037394

(51) Int. Cl.
*G11C 19/00* (2006.01)
(52) U.S. Cl.
USPC .................................. 377/64; 377/78; 377/79
(58) Field of Classification Search
CPC .......................... G11C 19/28; G09G 2310/0286
USPC ..................... 377/64, 68, 69, 77–80
See application file for complete search history.

(56) References Cited

U.S. PATENT DOCUMENTS

| | | | |
|---|---|---|---|
| 7,027,550 B2 | 4/2006 | Lin | |
| 7,859,507 B2 | 12/2010 | Jang et al. | |
| 8,040,313 B2 | 10/2011 | Jang | |
| 8,044,916 B2 | 10/2011 | Kim | |
| 8,306,177 B2 * | 11/2012 | Lee et al. | 377/64 |
| 8,422,621 B2 * | 4/2013 | Jang et al. | 377/64 |
| 8,565,370 B2 * | 10/2013 | Lee et al. | 377/64 |
| 2004/0150610 A1 | 8/2004 | Zebedee et al. | |
| 2007/0297559 A1 | 12/2007 | Cho et al. | |
| 2010/0034338 A1 | 2/2010 | Osame et al. | |
| 2011/0280362 A1 | 11/2011 | Jang | |
| 2012/0044133 A1 | 2/2012 | Nakamizo et al. | |
| 2012/0087459 A1 | 4/2012 | Nakamizo et al. | |
| 2012/0163528 A1 | 6/2012 | Jang et al. | |
| 2012/0194489 A1 | 8/2012 | Iwamoto et al. | |
| 2012/0269315 A1 * | 10/2012 | Jang et al. | 377/75 |

* cited by examiner

*Primary Examiner* — Tuan T Lam
(74) *Attorney, Agent, or Firm* — Birch, Stewart, Kolasch & Birch, LLP

(57) ABSTRACT

Discussed herein is a shift register which is capable of stabilizing an output thereof. The shift register includes a plurality of stages for sequentially outputting scan pulses in such a manner that high durations of the scan pulses partially overlap with each other. Each of the stages includes a node controller for controlling a charging duration of a set node, and an output unit for outputting a corresponding one of the scan pulses through an output terminal for the charging duration of the set node.

4 Claims, 16 Drawing Sheets nth stage nth stage nth stage nth stage nth stage

SHIFT REGISTER

The present application is a Divisional of U.S. patent application Ser. No. 13/338,022 filed Dec. 27, 2011, now U.S. Pat. No. 8,526,569, which claims priority to Korean Patent Application No. 10-2011-0037394, filed Apr. 21, 2011, the entire contents of all which are hereby incorporated by reference.

BACKGROUND OF THE INVENTION

1. Field of the Invention

The present invention relates to a shift register, and more particularly, to a shift register which is capable of stabilizing an output thereof.

2. Discussion of the Related Art

In general, a conventional shift register generates scan pulses using a plurality of clock pulses having phase differences therebetween, externally supplied thereto.

Such a clock pulse is periodically input to the drain electrode of a pull-up switching device which is in charge of output of the shift register. Whenever the clock pulse of a high state is supplied to the drain electrode of the pull-up switching device, a voltage at a set node may gradually increase due to a coupling phenomenon. As a result, the pull-up switching device may be turned on in an undesired period, resulting in unstable output.

SUMMARY OF THE INVENTION

Accordingly, the present invention is directed to a shift register that substantially obviates one or more problems due to limitations and disadvantages of the related art.

An object of the present invention is to provide a shift register which is capable of generating a scan pulse using a direct current voltage to remove a coupling phenomenon, so as to stabilize an output thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register includes a plurality of stages for sequentially outputting scan pulses in such a manner that high durations of the scan pulses partially overlap with each other, wherein each of the stages includes a node controller for controlling a charging duration of a set node, and an output unit for outputting a corresponding one of the scan pulses through an output terminal for the charging duration of the set node.

The node controller may maintain the charging duration for a time corresponding to a low duration of any one of a plurality of clock pulses having phase differences therebetween, and the output unit may output the corresponding scan pulse of a high state for the charging duration by selectively outputting a first charging voltage for the charging duration, the first charging voltage being a direct current (DC) voltage, wherein the plurality of clock pulses may be sequentially output in such a manner that low durations thereof partially overlap with each other.

The output unit may include a pull-up switching device controlled by a voltage at the set node and connected between a first charging voltage line transferring the first charging voltage and the output terminal.

The output unit may further include a pull-down switching device controlled by any one of the clock pulses and connected between the output terminal and a first discharging voltage line transferring a first discharging voltage.

In accordance with one aspect of the present invention, the node controller of an nth one of the stages (where n is a natural number) may include a first switching device controlled by any one of the clock pulses and connected between the output terminal of an (n−p)th one of the stages (where p is a natural number less than n) and a preset node, a second switching device controlled by any one of the clock pulses and connected between the set node and a second discharging voltage line transferring a second discharging voltage, and a third switching device controlled by a voltage at the preset node and connected between a second charging voltage line transferring a second charging voltage and the set node, wherein the first switching device, the second switching device and the pull-down switching device may all be supplied with the same clock pulse, wherein the clock pulse supplied to the first switching device, second switching device and pull-down switching device may have a low duration coinciding with a high duration of a scan pulse output from the nth stage, wherein the clock pulse supplied to the first switching device, second switching device and pull-down switching device may have a high duration partially overlapping with a high duration of a scan pulse from the (n−p)th stage.

The clock pulse may have a low voltage lower than or equal to the second discharging voltage, the second discharging voltage may be lower than or equal to the first discharging voltage, the clock pulse may have a high voltage lower than or equal to the first charging voltage, and the first charging voltage may be lower than or equal to the second charging voltage.

Each of the stages may further include a first capacitor connected between the set node and the output terminal, and a second capacitor connected between the preset node and the set node.

The node controller of the nth stage may further include a fourth switching device controlled by the scan pulse from the (n−p)th stage and connected between the set node and the second discharging voltage line.

Alternatively, the node controller of the nth stage may further include a fourth switching device controlled by a scan pulse from an (n+q)th one of the stages (where q is a natural number) and connected between the output terminal and the first discharging voltage line.

In accordance with another aspect of the present invention, the node controller of an nth one of the stages (where n is a natural number) may include a first switching device controlled by any one of the clock pulses and connected between the output terminal of an (n−p)th one of the stages (where p is a natural number less than n) and a preset node, a second switching device controlled by any one of the clock pulses and connected between the set node and a second discharging voltage line transferring a second discharging voltage, a third switching device controlled by a voltage at the preset node and connected between a second charging voltage line transferring a second charging voltage and the set node, a fourth switching device controlled by any one of the clock pulses and connected between the second charging voltage line and a reset node, and a fifth switching device controlled by the voltage at the preset node and connected between the reset node and the second discharging voltage line, and the output unit may further include a pull-down switching device controlled by a voltage at the reset node and connected between the output terminal and a first discharging voltage line transferring a first discharging voltage, wherein the first switching device, the second switching device and the fourth switching device may all be supplied with the same clock pulse, wherein the clock pulse supplied to the first switching device, second switching device and fourth switching device may have a low duration coinciding with a high duration of a scan pulse output from the nth stage, wherein the clock pulse supplied to the first switching device, second switching device and fourth switching device may have a high duration partially overlapping with a high duration of a scan pulse from the (n−p)th stage.

In accordance with another aspect of the present invention, the node controller of an nth one of the stages (where n is a natural number) may include a first switching device controlled by any one of the clock pulses and connected between the output terminal of an (n−p)th one of the stages (where p is a natural number less than n) and a first preset node, a second switching device controlled by any one of the clock pulses and connected between a second preset node and a second discharging voltage line transferring a second discharging voltage, a third switching device controlled by any one of the clock pulses and connected between the set node and the second discharging voltage line, a fourth switching device controlled by a voltage at the first preset node and connected between a third charging voltage line transferring a third charging voltage and the second preset node, and a fifth switching device controlled by a voltage at the second preset node and connected between a second charging voltage line transferring a second charging voltage and the set node, wherein the first switching device, the second switching device, the third switching device and the pull-down switching device may all be supplied with the same clock pulse, wherein the clock pulse supplied to the first switching device, second switching device, third switching device and pull-down switching device may have a low duration coinciding with a high duration of a scan pulse output from the nth stage, wherein the clock pulse supplied to the first switching device, second switching device, third switching device and pull-down switching device may have a high duration partially overlapping with a high duration of a scan pulse from the (n−p)th stage.

In accordance with another aspect of the present invention, the node controller of an nth one of the stages (where n is a natural number) may include a first switching device controlled by any one of the clock pulses and connected between the output terminal of an (n−p)th one of the stages (where p is a natural number less than n) and a forward preset node, a second switching device controlled by any one of the clock pulses and connected between the set node and a second discharging voltage line transferring a second discharging voltage, a third switching device controlled by a voltage at the forward preset node and connected between a forward voltage line transferring a forward voltage and the set node, a fourth switching device controlled by any one of the clock pulses and connected between a reverse preset node and the output terminal of an (n+q)th stage (where q is a natural number), and a fifth switching device controlled by a voltage at the reverse preset node and connected between the set node and a reverse voltage line transferring a reverse voltage, wherein the first switching device, the second switching device, the fourth switching device and the pull-down switching device may all be supplied with the same clock pulse, wherein the clock pulse supplied to the first switching device, second switching device, fourth switching device and pull-down switching device may have a low duration coinciding with a high duration of a scan pulse output from the nth stage, wherein the clock pulse supplied to the first switching device, second switching device, fourth switching device and pull-down switching device may have a high duration partially overlapping with a high duration of a scan pulse from the (n−p)th stage or a high duration of a scan pulse from the (n+q)th stage.

In accordance with a further aspect of the present invention, the node controller of an nth one of the stages (where n is a natural number) may include a first switching device controlled by any one of the clock pulses and connected between the output terminal of an (n−p)th one of the stages (where p is a natural number less than n) and a forward preset node, a second switching device controlled by any one of the clock pulses and connected between a common preset node and a second discharging voltage line transferring a second discharging voltage, a third switching device controlled by any one of the clock pulses and connected between the set node and the second discharging voltage line, a fourth switching device controlled by a voltage at the forward preset node and connected between a forward voltage line transferring a forward voltage and the common preset node, a fifth switching device controlled by a voltage at the common preset node and connected between a second charging voltage line transferring a second charging voltage and the set node, a sixth switching device controlled by any one of the clock pulses and connected between a reverse preset node and the output terminal of an (n+q)th stage (where q is a natural number), and a seventh switching device controlled by a voltage at the reverse preset node and connected between the common preset node and a reverse voltage line transferring a reverse voltage, wherein the first switching device, the second switching device, the third switching device, the sixth switching device and the pull-down switching device may all be supplied with the same clock pulse, wherein the clock pulse supplied to the first switching device, second switching device, third switching device, sixth switching device and pull-down switching device may have a low duration coinciding with a high duration of a scan pulse output from the nth stage, wherein the clock pulse supplied to the first switching device, second switching device, third switching device, sixth switching device and pull-down switching device may have a high duration partially overlapping with a high duration of a scan pulse from the (n−p)th stage or a high duration of a scan pulse from the (n+q)th stage.

The forward voltage may be higher than the reverse voltage in forward driving, and the reverse voltage may be higher than the forward voltage in reverse driving.

On the other hand, the nth stage may further include a first capacitor connected between the set node and the output terminal, and a second capacitor connected between the first preset node and the second preset node.

The third charging voltage may be the same as any one of the first charging voltage and second charging voltage.

The node controller of the nth stage may further include a sixth switching device controlled by a scan pulse from an (n+q)th stage (where q is a natural number) and connected between the output terminal of the nth stage and the first discharging voltage line.

Alternatively, the nth stage may further include a first capacitor connected between the set node and the output terminal, a second capacitor connected between the forward preset node and the set node, and a third capacitor connected between the set node and the reverse preset node.

As another alternative, the nth stage may further include a first capacitor connected between the set node and the output terminal, a second capacitor connected between the forward preset node and the common preset node, and a third capacitor connected between the common preset node and the reverse preset node.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
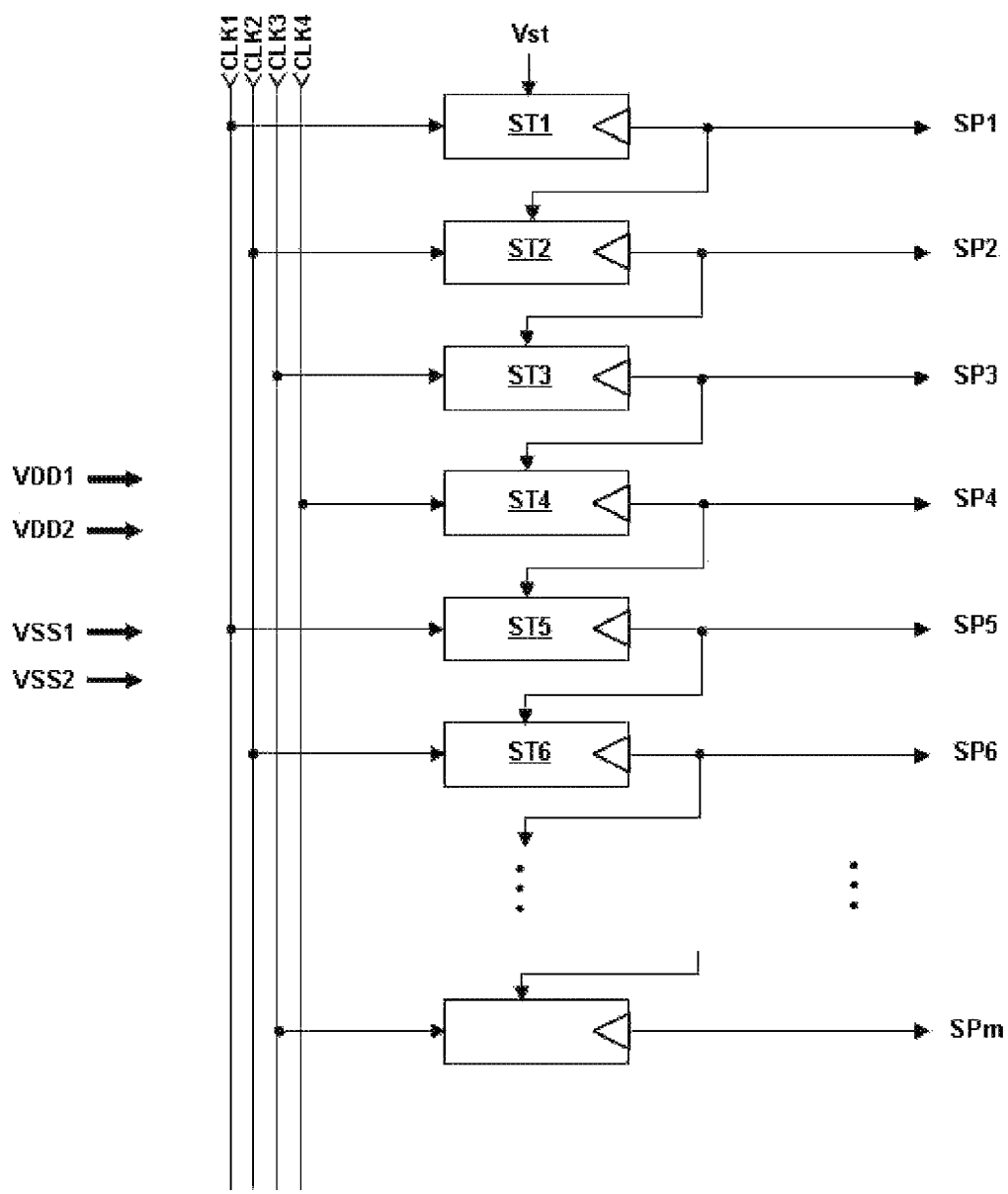
FIG. 1 is a block diagram showing the configuration of a shift register according to an embodiment of the present invention.
Figure 2:
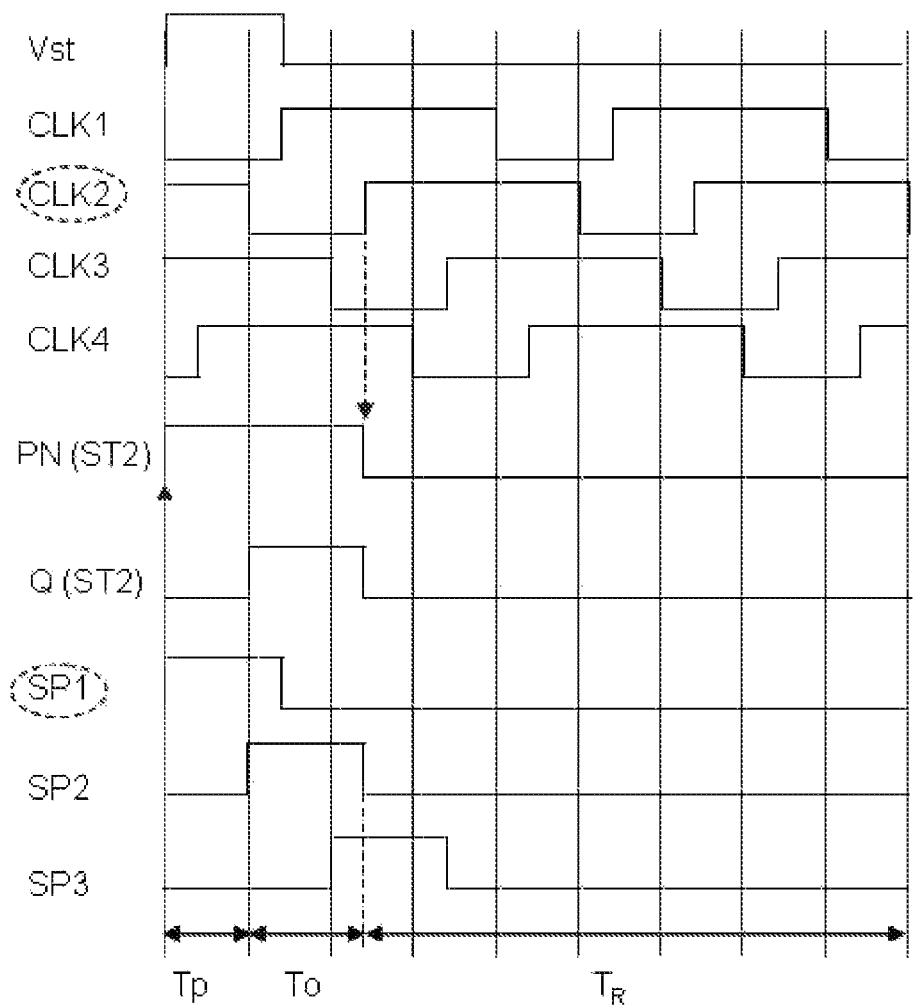
FIG. 2 is a timing diagram of various signals which are supplied to the shift register of FIG. 1 and various signals which are output therefrom.

FIG. 1 is a block diagram showing the configuration of a shift register according to an embodiment of the present invention, and FIG. 2 is a timing diagram of various signals which are supplied to the shift register of FIG. 1 and various signals which are output therefrom.

The shift register according to the present embodiment includes m stages ST1 to STm, as shown in FIG. 1. Each of the stages ST1 to STm outputs one scan pulse SP1 to SPm for one frame period through an output terminal OT thereof. At this time, as shown in FIG. 2, the stages ST1 to STm output the scan pulses SP1 to SPm in such a manner that high durations of scan pulses output in adjacent periods partially overlap with each other.

Each of the stages ST1 to STm drives a gate line connected thereto using the scan pulse. Also, each of the stages ST1 to STm controls the operation of a stage downstream therefrom using the scan pulse. Each stage may control the operations of stages upstream and downstream therefrom according to an internal circuit configuration thereof. In this case, a dummy stage may further be provided in addition to the above stages. This dummy stage is connected only to any one of the above stages, not to a gate line.

The stages ST1 to STm output the scan pulses in order from the first stage ST1 to the mth stage STm. That is, the first stage ST1 outputs the first scan pulse SP1, the second stage ST2 then outputs the second scan pulse SP2, the third stage ST3 then outputs the third scan pulse SP3, . . . , and the mth stage STm finally outputs the mth scan pulse SPm.

The scan pulses SP1 to SPm output from the stages ST1 to STm are sequentially supplied to gate lines of a liquid crystal panel (not shown) to sequentially scan the gate lines. Also, the scan pulse output from each of the stages ST1 to STm is supplied only to an upstream stage, is supplied to the upstream stage and a downstream stage or is supplied only to the downstream stage. For example, a scan pulse output from an nth stage (where n is a natural number less than m) may be supplied to an nth gate line and an (n+q)th stage (where q is a natural number), as shown in FIG. 1. Here, n is a natural number less than m, and the nth stage means any one of the m stages.

This shift register may be built in the liquid crystal panel. That is, the liquid crystal panel has a display region for displaying an image, and a non-display region surrounding the display region, and the shift register is built in the non-display region.

Each of the stages ST1 to STm of the shift register, configured in this manner, is supplied with a first charging voltage VDD1, a second charging voltage VDD2, a first discharging voltage VSS1, a second discharging voltage VSS2, and any one of first to fourth clock pulses CLK1 to CLK4 which are output sequentially out of phase with one another and cyclically. On the other hand, the first stage ST1 among the stages ST1 to STm is further supplied with a start pulse Vst.

The first and second charging voltages VDD1 and VDD2 are mainly used to charge nodes of each stage ST1 to STm, and the first and second discharging voltages VSS1 and VSS2 are mainly used to discharge the nodes and output terminal OT of each stage ST1 to STm.

The first and second charging voltages VDD1 and VDD2 and the first and second discharging voltages VSS1 and VSS2 are all direct current (DC) voltages. The first and second charging voltages VDD1 and VDD2 may be positive and the first and second discharging voltages VSS1 and VSS2 may be negative. Here, at least one of the first and second discharging voltages VSS1 and VSS2 may be a ground voltage.

The first to fourth clock pulses CLK1 to CLK4 are signals which are used for the respective stages ST1 to STm to generate the scan pulses SP1 to SPm. Each stage ST1 to STm receives any one of the first to fourth clock pulses CLK1 to CLK4 and outputs a corresponding one of the scan pulses SP1 to SPm. For example, a (4n+1)th stage may output a corresponding scan pulse using the first clock pulse CLK1, a (4n+2)th stage may output a corresponding scan pulse using the second clock pulse CLK2, a (4n+3)th stage may output a corresponding scan pulse using the third clock pulse CLK3, and a (4n+4)th stage may output a corresponding scan pulse using the fourth clock pulse CLK4.

The respective high voltages of these clock pulses CLK1 to CLK4 are all the same and the respective low voltages thereof are all the same.

These clock pulses CLK1 to CLK4 are sequentially output in such a manner that low durations thereof partially overlap with each other. For example, the first clock pulse CLK1 and second clock pulse CLK2 adjacent to each other may be output in such a manner that low durations thereof overlap with each other for a time corresponding to about ⅓ H (horizontal period). Alternatively, the overlap time may be ½ H. As the low durations of the adjacent clock pulses overlap with each other in this manner, the scan pulses have characteristics same as those of the clock pulses, too. That is, the scan pulses are output in such a manner that high durations of scan pulses output in adjacent periods overlap with each other for a certain period. Accordingly, the high duration of a scan pulse output from any one stage coincides with the low duration of a clock pulse supplied to that stage.

On the other hand, the start pulse Vst may overlap with the first clock pulse CLK1 or fourth clock pulse CLK4.

Although the four types of clock pulses having different phases are used for illustrative purposes in the present invention, any number of types of clock pulses may be used as long as they are two or more.

Here, the low voltage of any one of the clock pulses CLK1 to CLK4 is lower than or equal to the second discharging voltage VSS2, which is lower than or equal to the first discharging voltage VSS1.

Also, the high voltage of any one of the clock pulses CLK1 to CLK4 is lower than or equal to the first charging voltage VDD1, which is lower than or equal to the second charging voltage VDD2.

Each stage ST1 to STm is enabled in response to a scan pulse from an upstream stage. For example, as shown in FIG. 1, the nth stage is enabled in response to a scan pulse from an (n−1)th stage. Exceptionally, the first stage ST1 is enabled in response to the start pulse Vst from a timing controller (not shown).

Each stage ST1 to STm may be disabled by a clock pulse supplied thereto or a scan pulse from a downstream stage. For example, as shown in FIG. 1, the second stage ST2 may be disabled by the second clock pulse CLK2.

Hereinafter, a circuit configuration of each stage will be described in detail. All of the stages are the same in configuration, and the configuration of the nth stage, which is one arbitrary stage, will thus be representatively described.

Figure 3:
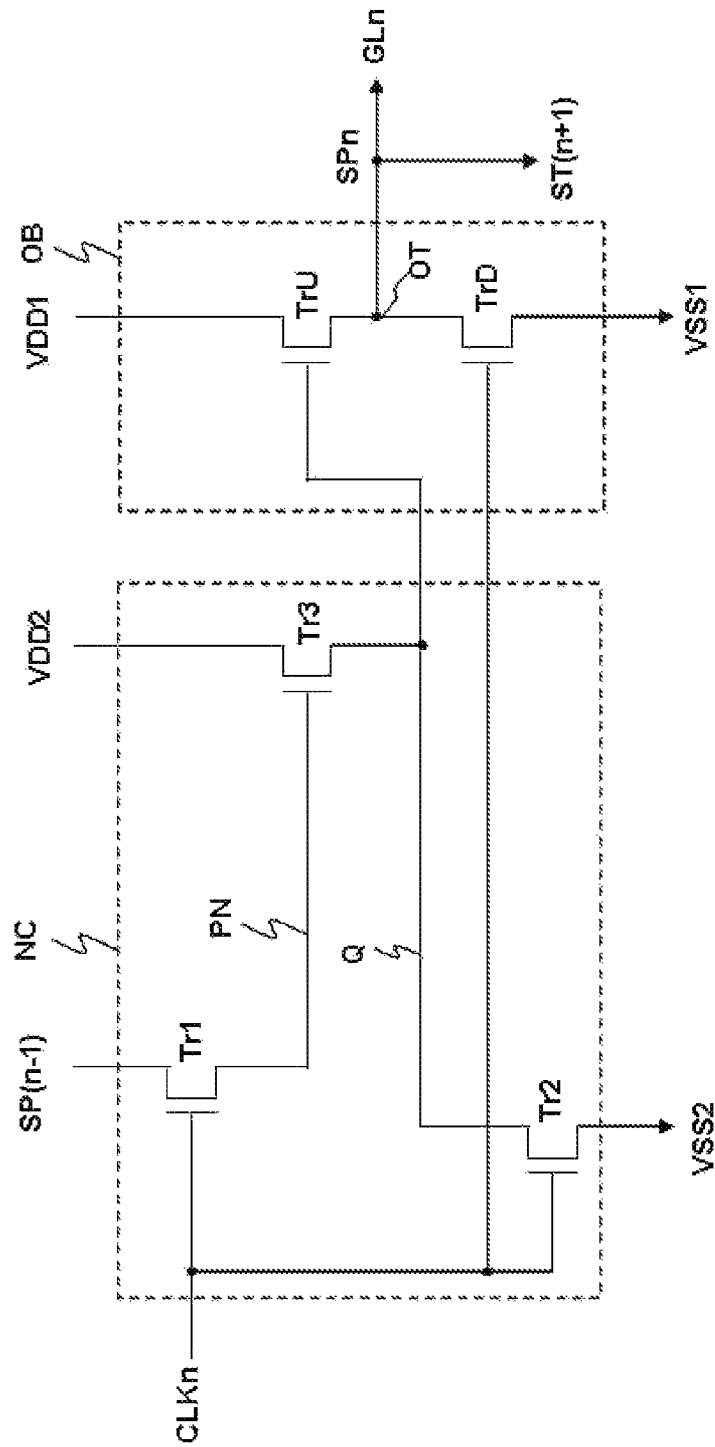
FIG. 3 is a circuit diagram of an arbitrary nth stage according to a first embodiment of the present invention.

FIG. 3 is a circuit diagram of an arbitrary nth stage according to a first embodiment of the present invention. The stages according to this first embodiment are supplied with the clock pulses CLK1 to CLK4 as shown in FIG. 2.

Each stage according to the first embodiment of the present invention includes, as shown in FIG. 3, a node controller NC for controlling a charging duration of a set node Q, and an output unit OB for outputting a corresponding scan pulse through an output terminal OT for the charging duration of the set node Q.

The node controller NC maintains the charging duration for a time corresponding to a low duration of any one of the plurality of clock pulses CLK1 to CLK4 having phase differences therebetween.

The output unit OB outputs the scan pulse of a high state for the charging duration by outputting the first charging voltage VDD1 for the charging duration.

To this end, the output unit OB and the node controller NC have configurations as follows.

The output unit OB of the nth stage includes a pull-up switching device TrU and a pull-down switching device TrD.

The pull-up switching device TrU is controlled by a voltage at the set node Q and is connected between a first charging voltage line which transfers the first charging voltage VDD1 and the output terminal OT of the nth stage.

The pull-down switching device TrD is controlled by any one of the clock pulses CLK1 to CLK4 and is connected between the output terminal OT of the nth stage and a first discharging voltage line which transfers the first discharging voltage VSS1. For example, the pull-down switching device TrD of the (4n+1)th stage may be controlled by the first clock pulse CLK1, the pull-down switching device TrD of the (4n+2)th stage may be controlled by the second clock pulse CLK2, the pull-down switching device TrD of the (4n+3)th stage may be controlled by the third clock pulse CLK3, and the pull-down switching device TrD of the (4n+4)th stage may be controlled by the fourth clock pulse CLK4.

The node controller NC of the nth stage (where n is a natural number) includes first to third switching devices Tr1 to Tr3.

The first switching device Tr1 is controlled by any one of the clock pulses CLK1 to CLK4 and is connected between the output terminal OT of an (n−p)th stage (where p is a natural number less than n) and a preset node PN. For example, the first switching device Tr1 of the second stage ST2 may be controlled by the second clock pulse CLK2 and be connected between the output terminal OT of the first stage ST1 and the preset node PN of the second stage ST2.

The second switching device Tr2 is controlled by any one of the clock pulses CLK1 to CLK4 and is connected between the set node Q and a second discharging voltage line which transfers the second discharging voltage VSS2. For example, the second switching device Tr2 of the second stage ST2 may be controlled by the second clock pulse CLK2 and be connected between the set node Q and the second discharging voltage line.

The third switching device Tr3 is controlled by a voltage at the preset node PN and is connected between a second charging voltage line which transfers the second charging voltage VDD2 and the set node Q.

Here, the first switching device Tr1, the second switching device Tr2 and the pull-down switching device TrD are all supplied with the same clock pulse.

The low duration of the clock pulse supplied to the first switching device Tr1, second switching device Tr2 and pull-down switching device TrD coincides with the high duration of the scan pulse output from the nth stage.

Also, the high duration of the clock pulse supplied to the first switching device Tr1, second switching device Tr2 and pull-down switching device TrD partially overlaps with the high duration of a scan pulse from the (n−p)th stage. For example, the clock pulse supplied to the first switching device Tr1, second switching device Tr2 and pull-down switching device TrD of the second stage ST2 may be the second clock pulse CLK2, the high duration of which may partially overlap with the high duration of the first scan pulse SP1 output from the first stage ST1, as shown in FIG. 2.

The operation of the nth stage configured in this manner will hereinafter be described in detail with reference to FIGS. 2 and 3. Here, it is assumed that the nth stage is the second stage ST2.

First, a description will be given of an operation in a preset period Tp.

The first switching device Tr1 of the second stage ST2 is kept turned on during the high duration of the second clock pulse CLK2. As shown in FIG. 2, the high duration of the second clock pulse CLK2 and the high duration of the first scan pulse SP1 partially overlap with each other, and the preset node PN is charged for a period in which those high durations overlap. That is, the first scan pulse SP1 is supplied to the preset node PN through the first switching device Tr1 turned on by the second clock pulse CLK2. Because a high to low transition of the second clock pulse CLK2 precedes that of the first scan pulse SP1, the first scan pulse SP1 of a high state is supplied to the preset node PN for a period from the turning-on to turning-off of the first switching device Tr1. As a result, for the preset period Tp, which is the period in which the high durations of the second clock pulse CLK2 and first scan pulse SP1 overlap, the preset node PN is charged with a voltage of high logic. Accordingly, the third switching device Tr3, connected to the preset node PN through the gate electrode thereof, is turned on, and the second charging voltage VDD2 is supplied to the set node Q through the turned-on third switching device Tr3.

On the other hand, in this preset period Tp, the second switching device Tr2 is also turned on by the second clock pulse CLK2 of the high state, and the second discharging voltage VSS2 is supplied to the set node Q through the turned-on second switching device Tr2.

In this manner, voltages of opposite logics, the second charging voltage VDD2 corresponding to a voltage of high logic and the second discharging voltage VSS2 corresponding to a voltage of low logic are together supplied to the preset node PN. At this time, the voltage at the set node Q is kept discharged by the second discharging voltage VSS2 corresponding to the voltage of the low logic, because the area of the second switching device Tr2 providing the second discharging voltage VSS2 is set to be larger than that of the third switching device Tr3 providing the second charging voltage VDD2. As a result, the pull-up switching device TrU, connected to the discharged set node Q through the gate electrode thereof, is turned off.

On the other hand, in this preset period Tp, the pull-down switching device TrD is also turned on by the second clock pulse CLK2 of the high state, and the first discharging voltage VSS1 is supplied to the output terminal OT through the turned-on pull-down switching device TrD.

Next, a description will be given of an operation in an output period To.

In the output period To, the second clock pulse CLK2 makes a high to low transition, thereby causing the first switching device Tr1, second switching device Tr2 and pull-down switching device TrD, supplied with the second clock pulse CLK2 through the gate electrodes thereof, to be all turned off.

As the first switching device Tr1 is turned off, the preset node PN floats, and a voltage corresponding to the first scan pulse SP1 of the high state is maintained at the floating preset node PN. Accordingly, the third switching device Tr3, connected to the preset node PN through the gate electrode thereof, still remains turned on even in the output period To. At this time, the voltage at the floating preset node PN is bootstrapped by a parasitic capacitor of the third switching device Tr3 and the second charging voltage VDD2 applied to the drain electrode of the third switching device Tr3, thereby causing the third switching device Tr3 to be completely turned on in the output period To, so as to supply the second charging voltage VDD2 to the set node Q with little loss.

Particularly, in this output period To, the second discharging voltage VSS2 is no longer supplied to the set node Q as the second switching device Tr2 is turned off. As a result, in the output period To, the set node Q is charged with the second charging voltage VDD2. Accordingly, the pull-up switching device TrU, connected to the charged set node Q through the gate electrode thereof, is turned on, and the first charging voltage VDD1 is output through the turned-on pull-up switching device TrU. That is, the pull-up switching device TrU outputs the first charging voltage VDD1 as the second scan pulse SP2 and supplies it to the second gate line and the third stage ST3 through the output terminal OT of the second stage ST2. At this time, the second scan pulse SP2 supplied to the third stage ST3 is applied to the drain electrode of the first switching device Tr1 of the third stage ST3.

On the other hand, in this output period To, the second clock pulse CLK2 of a low state is supplied to the gate electrode of the second switching device Tr2 and the second discharging voltage VSS2 is supplied to the source electrode of the second switching device Tr2. Particularly, the voltage of the second clock pulse CLK2 of the low state is set to be lower than the second discharging voltage VSS2, thereby making it possible to prevent leakage current from the second switching device Tr2. Consequently, in the output period To, leakage of current from the set node Q is prevented, so that the pull-up transistor TrU can normally output the scan pulse.

Next, a description will be given of an operation in a reset period $T_R$.

In the reset period $T_R$, the second clock pulse CLK2 returns to the high state. As a result, the first switching device Tr1, second switching device Tr2 and pull-down switching device TrD, supplied with the second clock pulse CLK2 through the gate electrodes thereof, are all turned on.

Particularly, in this reset period $T_R$, the first scan pulse SP1 is kept low. Accordingly, the first scan pulse SP1 of the low state is supplied to the preset node PN through the turned-on first switching device Tr1. Consequently, the preset node PN is discharged, and the third switching device Tr3, connected to the discharged preset node PN through the gate electrode thereof, is turned off.

On the other hand, the second discharging voltage VSS2 is supplied to the set node Q through the turned-on second switching device Tr2, so as to discharge the set node Q. As a result, the pull-up switching device TrU, connected to the discharged set node Q through the gate electrode thereof, is turned off.

Consequently, in this reset period $T_R$, the first discharging voltage VSS1 is supplied to the output terminal OT through the turned-on pull-down switching device TrD.

On the other hand, in this reset period $T_R$, the voltage at the preset node PN, the voltage at the set node Q and the voltage at the output terminal OT are periodically discharged respectively by the first scan pulse SP1 of the low state, the second discharging voltage VSS2 and the first discharging voltage VSS1 based on the periodically supplied second clock pulse CLK2 of the high state, so that stability of the circuit can be secured.

Through these preset period Tp, output period To and reset period $T_R$, the second stage ST2 outputs the second scan pulse SP2 which is kept high for the output period To. In conclusion, the time length of the output period To is the same as the previously stated charging duration.

Also, the other stages output their respective scan pulses through the preset period Tp, output period To and reset period $T_R$ in the same manner.

Figure 4:
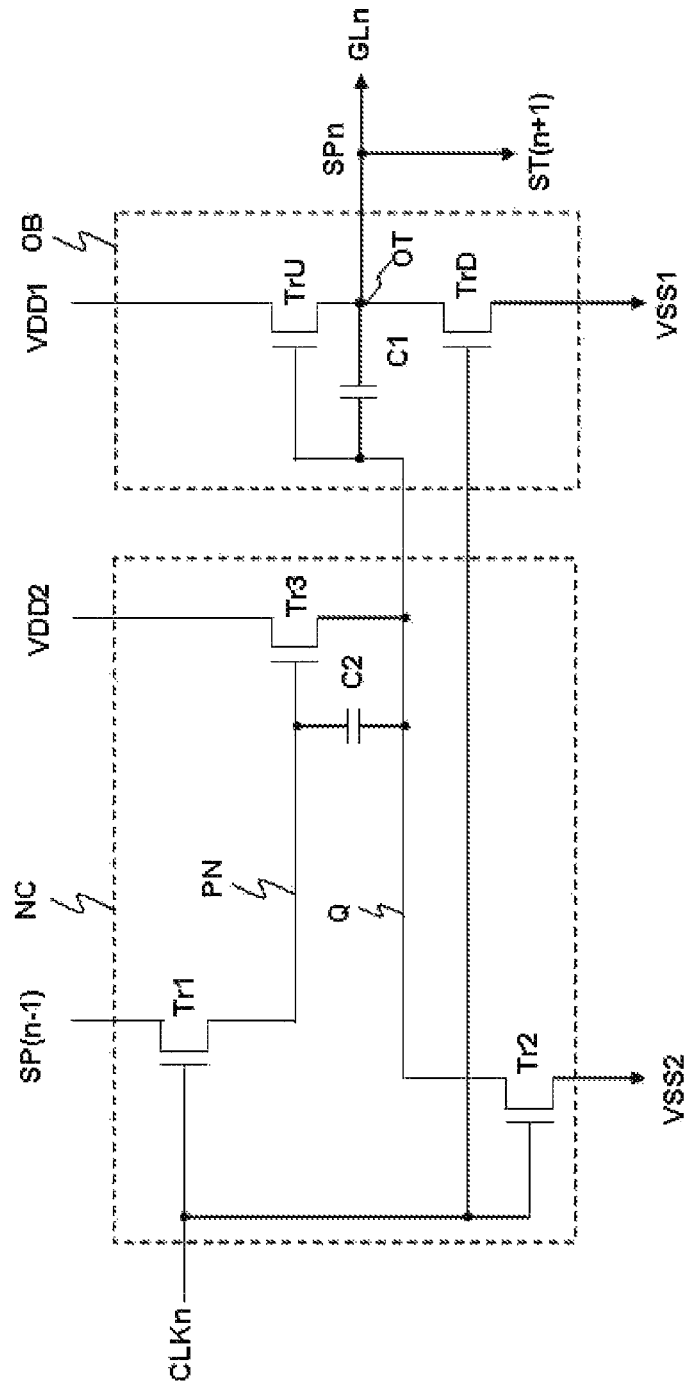
FIG. 4 is a circuit diagram of an arbitrary nth stage according to a second embodiment of the present invention.

FIG. 4 is a circuit diagram of an arbitrary nth stage according to a second embodiment of the present invention. The stages according to this second embodiment are supplied with the clock pulses CLK1 to CLK4 as shown in FIG. 2.

Each stage according to the second embodiment of the present invention further includes first and second capacitors C1 and C2 in addition to the above-stated configuration of the first embodiment, as shown in FIG. 4.

The first and second capacitors C1 and C2 are used to more effectively bootstrap the voltage at the set node Q and the voltage at the preset node PN, respectively. Also, the first and second capacitors C1 and C2 function to reduce a ripple of the voltage at the set node Q and a ripple of the voltage at the preset node PN, respectively.

The other components of the second embodiment, not described, are the same as those of the first embodiment, stated above. For example, the first and second charging voltages VDD1 and VDD2 and the first and second discharging voltages VSS1 and VSS2 in the second embodiment have the same characteristics as those in the first embodiment.

Figure 5:
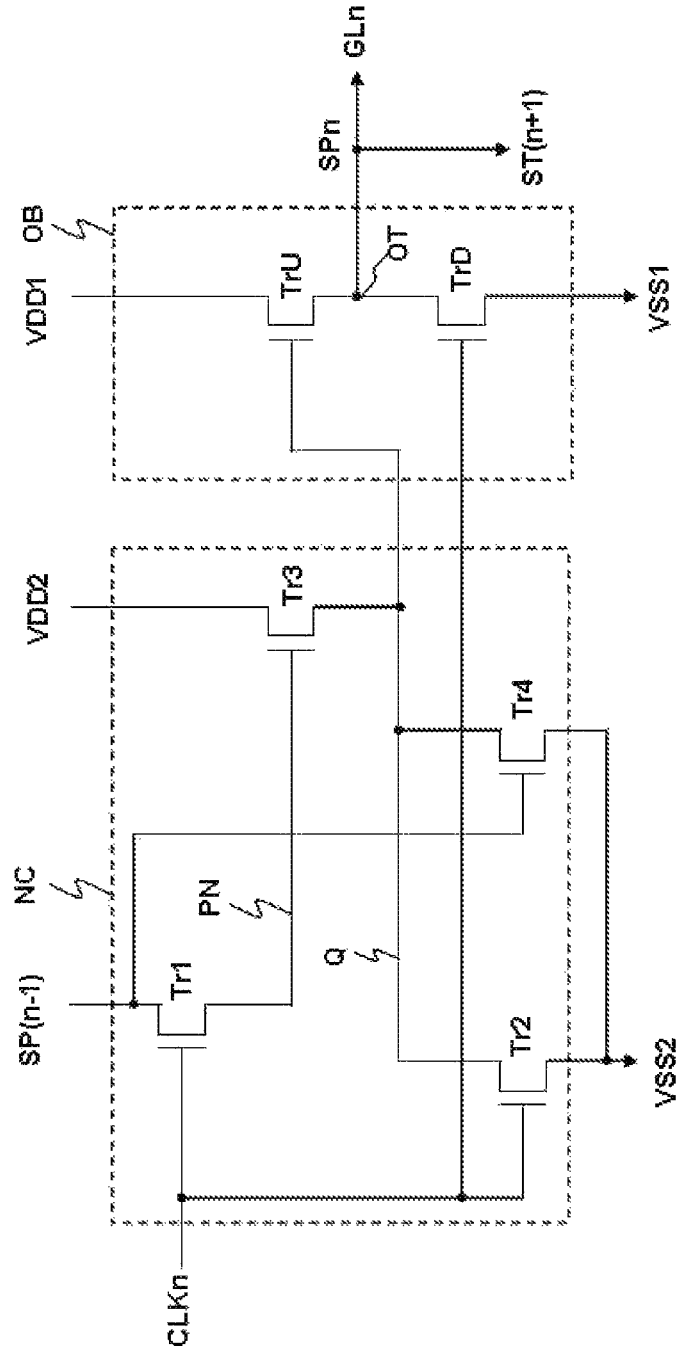
FIG. 5 is a circuit diagram of an arbitrary nth stage according to a third embodiment of the present invention.

FIG. 5 is a circuit diagram of an arbitrary nth stage according to a third embodiment of the present invention. The stages according to this third embodiment are supplied with the clock pulses CLK1 to CLK4 as shown in FIG. 2.

Each stage according to the third embodiment of the present invention further includes a fourth switching device Tr4 in addition to the above-stated configuration of the first embodiment, as shown in FIG. 5. The fourth switching device Tr4 may be provided in any one of the node controller NC and output unit OB. FIG. 5 shows an example in which the fourth switching device Tr4 is provided in the node controller NC.

The fourth switching device Tr4 of the nth stage according to the third embodiment is controlled by the scan pulse from the (n−p)th stage and is connected between the set node Q and the second discharging voltage line. For example, the fourth switching device Tr4 may be controlled by the scan pulse from the (n−1)th stage.

The further provision of the fourth switching device Tr4 has the advantage of reducing the area of the second switching device Tr2 driven directly by the clock pulse as compared with that in the first embodiment.

The other components of the third embodiment, not described, are the same as those of the first embodiment, stated above. For example, the first and second charging voltages VDD1 and VDD2 and the first and second discharging voltages VSS1 and VSS2 in the third embodiment have the same characteristics as those in the first embodiment.

Figure 6:
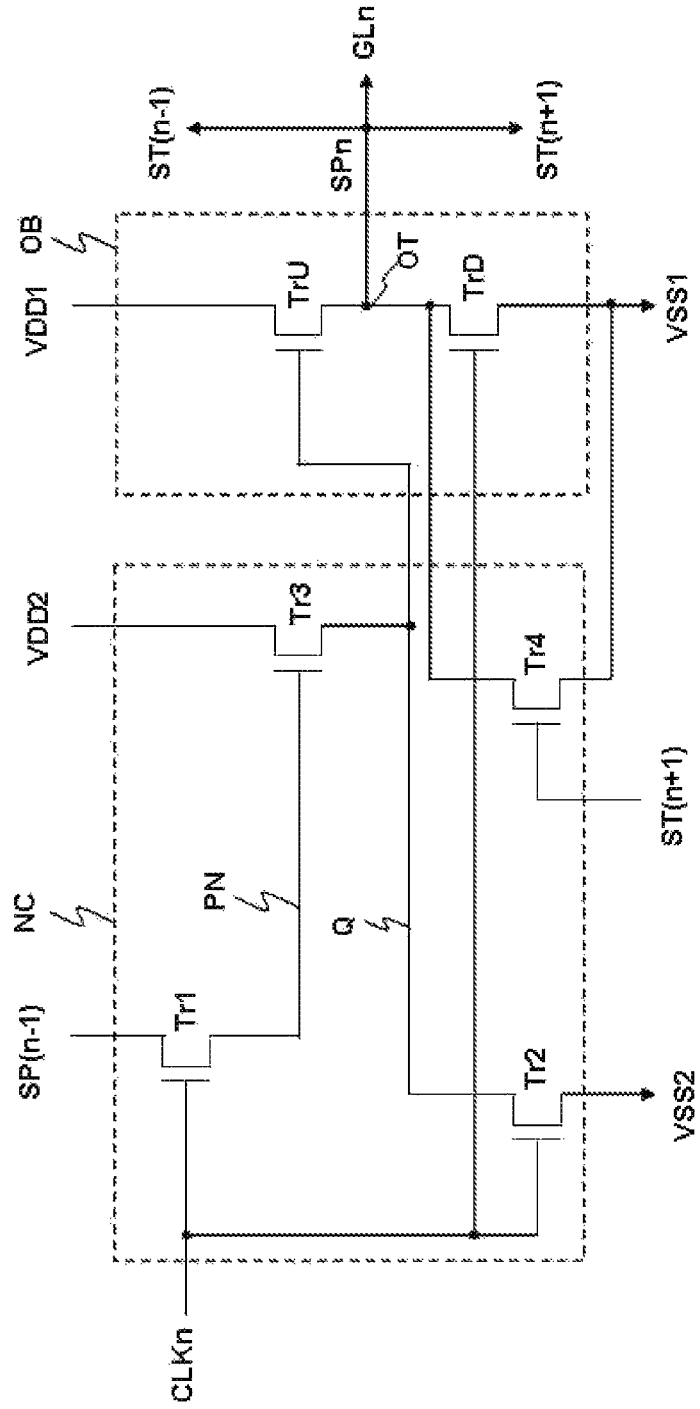
FIG. 6 is a circuit diagram of an arbitrary nth stage according to a fourth embodiment of the present invention.
Figure 7:
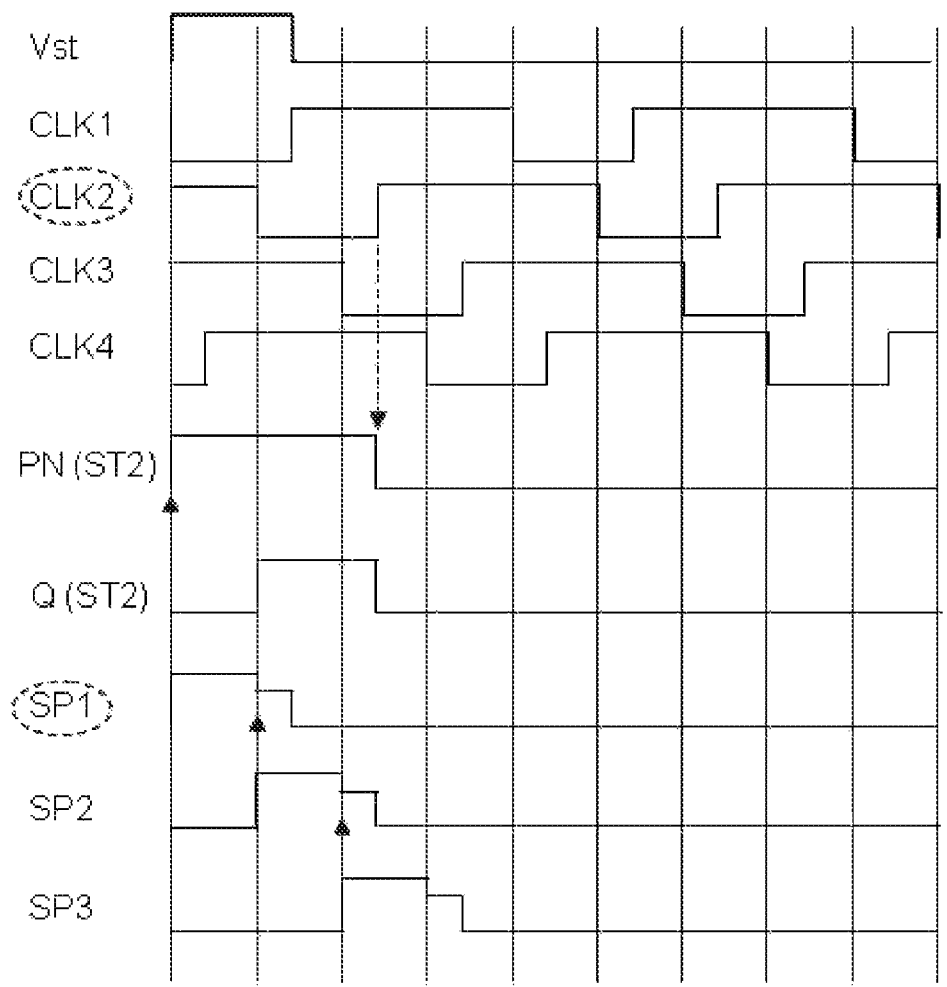
FIG. 7 is a timing diagram illustrating an output waveform from the stage of FIG. 6.

FIG. 6 is a circuit diagram of an arbitrary nth stage according to a fourth embodiment of the present invention, and FIG. 7 is a timing diagram illustrating an output waveform from the stage of FIG. 6.

The stages according to this fourth embodiment are supplied with the clock pulses CLK1 to CLK4 as shown in FIG. 2.

Each stage according to the fourth embodiment of the present invention further includes a fourth switching device Tr4 in addition to the above-stated configuration of the first embodiment, as shown in FIG. 6. The fourth switching device Tr4 may be provided in any one of the node controller NC and output unit OB. FIG. 6 shows an example in which the fourth switching device Tr4 is provided in the node controller NC.

The fourth switching device Tr4 of the nth stage according to the fourth embodiment is controlled by a scan pulse from an (n+q)th stage (where q is a natural number) and is connected between the output terminal OT and the first discharging voltage line. For example, the fourth switching device Tr4 may be controlled by a scan pulse from an (n+1)th stage or a scan pulse from an (n+2)th stage. FIG. 7 shows an example in which the scan pulse from the (n+1)th stage is supplied to the gate electrode of the fourth switching device Tr4.

This fourth switching device Tr4 drops the voltage at the output terminal of a corresponding stage in response to a scan pulse from a downstream stage. As a result, the scan pulse from each stage slightly falls at the time that the scan pulse from the downstream stage makes a low to high transition, as shown in FIG. 7. Consequently, each scan pulse has a low state, a high state, and a middle state. That is, each scan pulse makes a high to low transition, not directly, but via the middle state, thereby making it possible to reduce a kickback voltage within the liquid crystal panel.

On the other hand, in the case where the scan pulse from the (n+2)th stage is supplied to the gate electrode of the fourth switching device Tr4 instead of the scan pulse from the (n+1)th stage, each scan pulse does not have the above middle state. That is, in this case, each scan pulse has a square wave of a form as shown in FIG. 2.

The other components of the fourth embodiment, not described, are the same as those of the first embodiment, stated above. For example, the first and second charging voltages VDD1 and VDD2 and the first and second discharging voltages VSS1 and VSS2 in the fourth embodiment have the same characteristics as those in the first embodiment.

Figure 8:
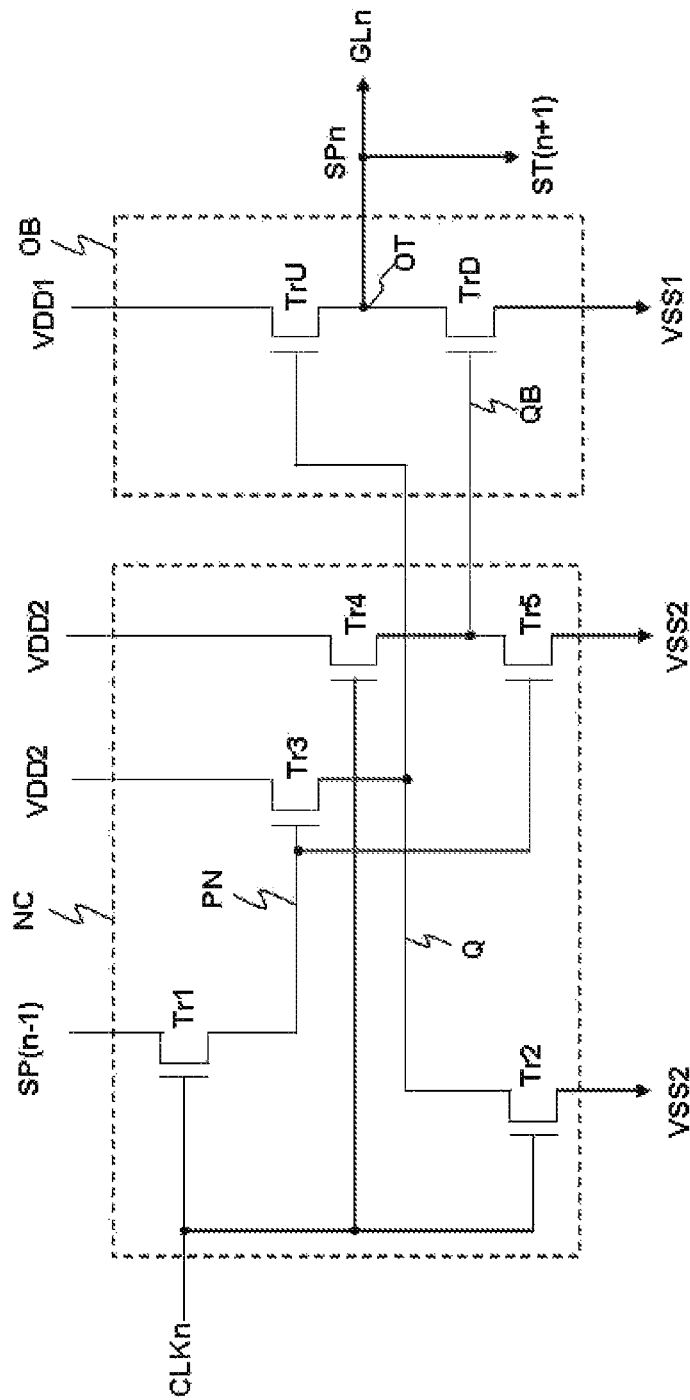
FIG. 8 is a circuit diagram of an arbitrary nth stage according to a fifth embodiment of the present invention.

FIG. 8 is a circuit diagram of an arbitrary nth stage according to a fifth embodiment of the present invention. The stages according to this fifth embodiment are supplied with the clock pulses CLK1 to CLK4 as shown in FIG. 2.

Each stage according to the fifth embodiment of the present invention includes, as shown in FIG. 8, a node controller NC for controlling a charging duration of a set node Q, and an output unit OB for outputting a corresponding scan pulse through an output terminal OT for the charging duration of the set node Q.

The node controller NC of the nth stage (where n is a natural number) includes first to fifth switching devices Tr1 to Tr5.

The first switching device Tr1 is controlled by any one of the clock pulses CLK1 to CLK4 and is connected between the output terminal OT of an (n−p)th stage (where p is a natural number less than n) and a preset node PN. For example, the first switching device Tr1 of the second stage ST2 may be controlled by the second clock pulse CLK2 and be connected between the output terminal OT of the first stage ST1 and the preset node PN of the second stage ST2.

The second switching device Tr2 is controlled by any one of the clock pulses CLK1 to CLK4 and is connected between the set node Q and a second discharging voltage line which transfers the second discharging voltage VSS2. For example, the second switching device Tr2 of the second stage ST2 may be controlled by the second clock pulse CLK2 and be connected between the set node Q and the second discharging voltage line.

The third switching device Tr3 is controlled by a voltage at the preset node PN and is connected between a second charging voltage line which transfers the second charging voltage VDD2 and the set node Q.

The fourth switching device Tr4 is controlled by any one of the clock pulses CLK1 to CLK4 and is connected between the second charging voltage line and a reset node QB. For example, the fourth switching device Tr4 of the second stage ST2 may be controlled by the second clock pulse CLK2.

The fifth switching device Tr5 is controlled by the voltage at the preset node PN and is connected between the reset node QB and the second discharging voltage line.

The output unit OB of the nth stage includes a pull-up switching device TrU and a pull-down switching device TrD.

The pull-up switching device TrU is controlled by a voltage at the set node Q and is connected between a first charging voltage line which transfers the first charging voltage VDD1 and the output terminal OT of the nth stage.

The pull-down switching device TrD is controlled by a voltage at the reset node QB and is connected between the output terminal OT of the nth stage and a first discharging voltage line which transfers the first discharging voltage VSS1.

Here, the first switching device Tr1, the second switching device Tr2 and the fourth switching device Tr4 are all supplied with the same clock pulse.

The low duration of the clock pulse supplied to the first switching device Tr1, second switching device Tr2 and fourth switching device Tr4 coincides with the high duration of the scan pulse output from the nth stage.

Also, the high duration of the clock pulse supplied to the first switching device Tr1, second switching device Tr2 and fourth switching device Tr4 partially overlaps with the high duration of a scan pulse from the (n−p)th stage. For example, the clock pulse supplied to the first switching device Tr1, second switching device Tr2 and fourth switching device Tr4 of the second stage ST2 may be the second clock pulse CLK2, the high duration of which may partially overlap with the high duration of the first scan pulse SP1 output from the first stage ST1, as shown in FIG. 2.

The pull-down switching device TrD is not driven directly by the clock pulse, but is controlled by the voltage at the reset node QB, so that a load on the clock pulse can be reduced.

Here, the voltage state of the reset node QB is controlled by the fourth and fifth switching devices Tr4 and Tr5. That is, the fourth switching device Tr4 acts to charge the reset node QB with the second charging voltage VDD2 in a reset period $T_R$, whereas the fifth switching device Tr5 acts to discharge the reset node QB with the second discharging voltage VSS2 in a preset period Tp and an output period To.

The other components of the fifth embodiment, not described, are the same as those of the first embodiment, stated above. For example, the first and second charging voltages VDD1 and VDD2 and the first and second discharging voltages VSS1 and VSS2 in the fifth embodiment have the same characteristics as those in the first embodiment.

Figure 9:
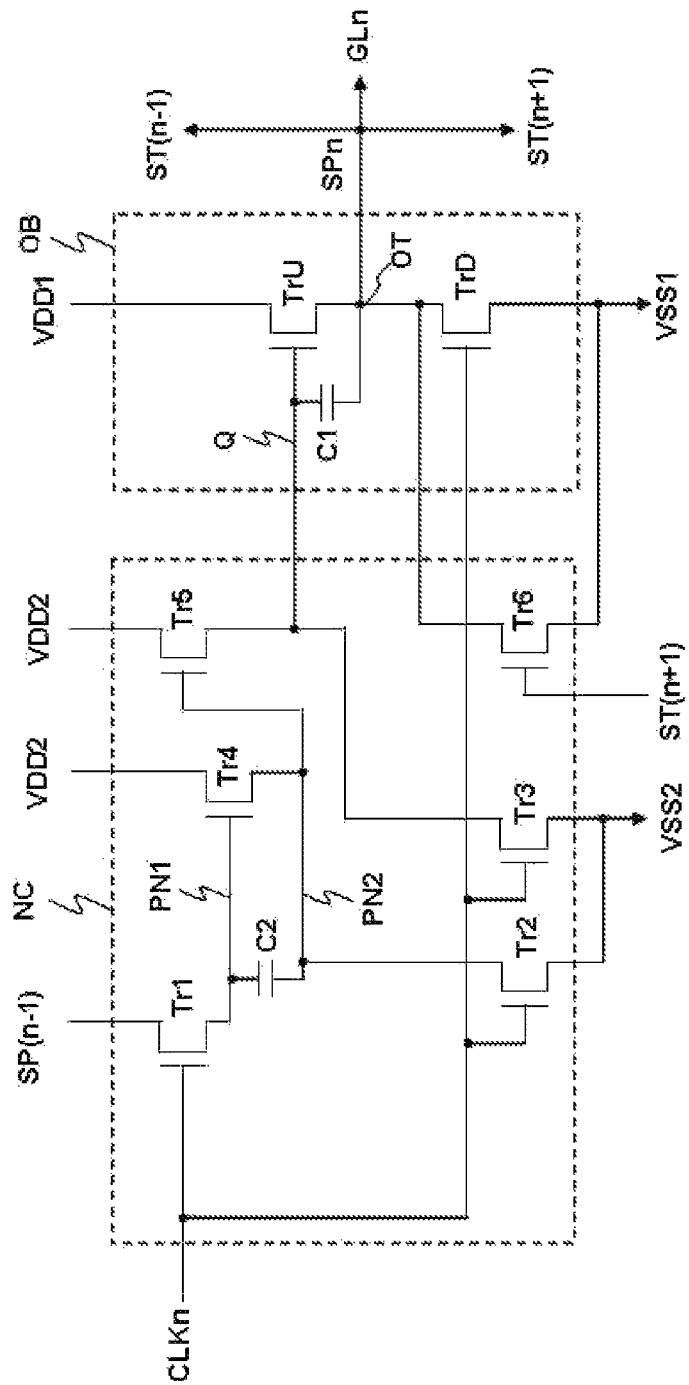
FIG. 9 is a circuit diagram of an arbitrary nth stage according to a sixth embodiment of the present invention.

FIG. 9 is a circuit diagram of an arbitrary nth stage according to a sixth embodiment of the present invention. The stages according to this sixth embodiment are supplied with the clock pulses CLK1 to CLK4 as shown in FIG. 2.

Each stage according to the sixth embodiment of the present invention includes, as shown in FIG. 9, a node controller NC for controlling a charging duration of a set node Q, an output unit OB for outputting a corresponding scan pulse through an output terminal OT for the charging duration of the set node Q, and first and second capacitors C1 and C2.

The first capacitor C1 is connected between the set node Q and the output terminal OT, and the second capacitor C2 is connected between a first preset node PN1 and a second preset node PN2.

The node controller NC of the nth stage (where n is a natural number) includes first to sixth switching devices Tr1 to Tr6.

The first switching device Tr1 is controlled by any one of the clock pulses CLK1 to CLK4 and is connected between the output terminal OT of an (n−p)th stage (where p is a natural number less than n) and the first preset node PN1. For example, the first switching device Tr1 of the second stage ST2 may be controlled by the second clock pulse CLK2 and be connected between the output terminal OT of the first stage ST1 and the first preset node PN1 of the second stage ST2.

The second switching device Tr2 is controlled by any one of the clock pulses CLK1 to CLK4 and is connected between the second preset node PN2 and a second discharging voltage line which transfers the second discharging voltage VSS2. For example, the second switching device Tr2 of the second stage ST2 may be controlled by the second clock pulse CLK2.

The third switching device Tr3 is controlled by any one of the clock pulses CLK1 to CLK4 and is connected between the set node Q and the second discharging voltage line. For example, the third switching device Tr3 of the second stage ST2 may be controlled by the second clock pulse CLK2.

The fourth switching device Tr4 is controlled by a voltage at the first preset node PN1 and is connected between a second charging voltage line which transfers the second charging voltage VDD2 and the second preset node PN2. On the other hand, the fourth switching device Tr4 may be connected to a third charging voltage line (not shown) instead of the second charging voltage line. The third charging voltage line transfers a third charging voltage (not shown). The third charging voltage may be the same as any one of the first charging voltage VDD1 and second charging voltage VDD2.

The fifth switching device Tr5 is controlled by a voltage at the second preset node PN2 and is connected between the second charging voltage line and the set node Q.

The sixth switching device Tr6 is controlled by a scan pulse from an (n+q)th stage (where q is a natural number) and is connected between the output terminal OT of the nth stage and a first discharging voltage line which transfers the first discharging voltage VSS1. For example, the sixth switching device Tr6 of the nth stage may be controlled by a scan pulse from an (n+1)th stage and be connected between the output terminal OT of the nth stage and the first discharging voltage line.

The output unit OB of the nth stage includes a pull-up switching device TrU and a pull-down switching device TrD.

The pull-up switching device TrU is controlled by a voltage at the set node Q and is connected between a first charging voltage line which transfers the first charging voltage VDD1 and the output terminal OT of the nth stage.

The pull-down switching device TrD is controlled by any one of the clock pulses CLK1 to CLK4 and is connected between the output terminal OT of the nth stage and the first discharging voltage line which transfers the first discharging voltage VSS1. For example, the pull-down switching device TrD of the (4n+1)th stage may be controlled by the first clock pulse CLK1, the pull-down switching device TrD of the (4n+2)th stage may be controlled by the second clock pulse CLK2, the pull-down switching device TrD of the (4n+3)th stage may be controlled by the third clock pulse CLK3, and the pull-down switching device TrD of the (4n+4)th stage may be controlled by the fourth clock pulse CLK4.

The other components of the sixth embodiment, not described, are the same as those of the first embodiment, stated above. For example, the first and second charging voltages VDD1 and VDD2 and the first and second discharging voltages VSS1 and VSS2 in the sixth embodiment have the same characteristics as those in the first embodiment.

The operation of the nth stage configured in this manner will hereinafter be described in detail with reference to FIGS. 2 and 9. Here, it is assumed that the nth stage is the second stage ST2.

First, a description will be given of an operation in a preset period Tp.

The first switching device Tr1 of the second stage ST2 is kept turned on during the high duration of the second clock pulse CLK2. As shown in FIG. 2, the high duration of the second clock pulse CLK2 and the high duration of the first scan pulse SP1 partially overlap with each other, and the first preset node PN1 is charged for a period in which those high durations overlap. That is, the first scan pulse SP1 is supplied to the first preset node PN1 through the first switching device Tr1 turned on by the second clock pulse CLK2. Because a high to low transition of the second clock pulse CLK2 precedes that of the first scan pulse SP1, the first scan pulse SP1 of a high state is supplied to the first preset node PN1 for a period from the turning-on to turning-off of the first switching device Tr1. As a result, for the preset period Tp, which is the period in which the high durations of the second clock pulse CLK2 and first scan pulse SP1 overlap, the first preset node PN1 is charged with a voltage of high logic. Accordingly, the fourth switching device Tr4, connected to the first preset node PN1 through the gate electrode thereof, is turned on, and the second charging voltage VDD2 is supplied to the second preset node PN2 through the turned-on fourth switching device Tr4.

On the other hand, in this preset period Tp, the second and third switching devices Tr2 and Tr3 are also turned on by the second clock pulse CLK2 of the high state, and the second discharging voltage VSS2 is supplied to the second preset node PN2 through the turned-on second switching device Tr2 and to the set node Q through the turned-on third switching device Tr3.

In this manner, voltages of opposite logics, the second charging voltage VDD2 corresponding to a voltage of high logic and the second discharging voltage VSS2 corresponding to a voltage of low logic are together supplied to the second preset node PN2. At this time, the voltage at the second preset node PN2 is kept discharged by the second discharging voltage VSS2 corresponding to the voltage of the low logic, because the area of the second switching device Tr2 providing the second discharging voltage VSS2 is set to be larger than that of the fourth switching device Tr4 providing the second charging voltage VDD2. As a result, the fifth switching device Tr5, connected to the discharged second preset node PN2 through the gate electrode thereof, is turned off.

On the other hand, the set node Q is discharged by the second discharging voltage VSS2 supplied thereto by the turned-on third switching device Tr3, and the pull-up switching device TrU, connected to the discharged set node Q through the gate electrode thereof, is turned off.

On the other hand, in this preset period Tp, the pull-down switching device TrD is also turned on by the second clock pulse CLK2 of the high state, and the first discharging voltage VSS1 is supplied to the output terminal OT through the turned-on pull-down switching device TrD.

On the other hand, in this preset period Tp, the third scan pulse SP3 from the third stage ST3 is low, thereby causing the sixth switching device Tr6, supplied with the third scan pulse SP3 of the low state through the gate electrode thereof, to be turned off.

Next, a description will be given of an operation in an output period To.

In the output period To, the second clock pulse CLK2 makes a high to low transition, thereby causing the first switching device Tr1, second switching device Tr2, third switching device Tr3 and pull-down switching device TrD, supplied with the second clock pulse CLK2 through the gate electrodes thereof, to be all turned off.

As the first switching device Tr1 is turned off, the first preset node PN1 floats, and a voltage corresponding to the first scan pulse SP1 of the high state is maintained at the floating first preset node PN1. Accordingly, the fourth switching device Tr4, connected to the first preset node PN1 through the gate electrode thereof, still remains turned on even in the output period To. At this time, the voltage at the floating first preset node PN1 is bootstrapped by a parasitic capacitor of the fourth switching device Tr4 and the second charging voltage VDD2 applied to the drain electrode of the fourth switching device Tr4, thereby causing the fourth switching device Tr4 to be completely turned on in the output period To, so as to supply the second charging voltage VDD2 to the second preset node PN2 with little loss.

Particularly, in this output period To, the second discharging voltage VSS2 is no longer supplied to the second preset node PN2 as the second switching device Tr2 is turned off. As a result, in the output period To, the second preset node PN2 is charged with the second charging voltage VDD2. Accordingly, the fifth switching device Tr5, connected to the charged second preset node PN2 through the gate electrode thereof, is turned on, and the second charging voltage VDD2 is supplied to the set node Q through the turned-on fifth switching device Tr5. Then, the set node Q is charged with the second charging voltage VDD2, and the pull-up switching device TrU, connected to the charged set node Q through the gate electrode thereof, is turned on. Consequently, the first charging voltage VDD1 is output through the turned-on pull-up switching device TrU. That is, the pull-up switching device TrU outputs the first charging voltage VDD1 as the second scan pulse SP2 and supplies it to the second gate line and the third stage ST3 through the output terminal OT of the second stage ST2. At this time, the second scan pulse SP2 supplied to the third stage ST3 is applied to the drain electrode of the first switching device Tr1 of the third stage ST3.

On the other hand, in this output period To, the second clock pulse CLK2 of the low state is supplied to each of the gate electrodes of the second and third switching devices Tr2 and Tr3 and the second discharging voltage VSS2 is supplied to each of the source electrodes of the second and third switching devices Tr2 and Tr3. Particularly, the voltage of the second clock pulse CLK2 of the low state is set to be lower than the second discharging voltage VSS2, thereby making it possible to prevent leakage current from the second and third switching devices Tr2 and Tr3. Consequently, in the output period To, leakage of current from the second preset node PN2 and set node Q is prevented, so that the pull-up transistor TrU can normally output the scan pulse.

Next, a description will be given of an operation in a reset period $T_R$.

In the reset period $T_R$, the second clock pulse CLK2 returns to the high state. As a result, the first switching device Tr1, second switching device Tr2, third switching device Tr3 and pull-down switching device TrD, supplied with the second clock pulse CLK2 through the gate electrodes thereof, are all turned on.

Particularly, in this reset period $T_R$, the first scan pulse SP1 is kept low. Accordingly, the first scan pulse SP1 of the low state is supplied to the first preset node PN1 through the turned-on first switching device Tr1. Consequently, the first preset node PN1 is discharged, and the fourth switching device Tr4, connected to the discharged first preset node PN1 through the gate electrode thereof, is turned off.

On the other hand, the second discharging voltage VSS2 is supplied to the second preset node PN2 through the turned-on second switching device Tr2, so as to discharge the second preset node PN2. As a result, the fifth switching device Tr5, connected to the discharged second preset node PN2 through the gate electrode thereof, is turned off.

Also, the second discharging voltage VSS2 is supplied to the set node Q through the turned-on third switching device Tr3, so as to discharge the set node Q. As a result, the pull-up switching device TrU, connected to the discharged set node Q through the gate electrode thereof, is turned off.

Consequently, in this reset period $T_R$, the first discharging voltage VSS1 is supplied to the output terminal OT through the turned-on pull-down switching device TrD.

On the other hand, in an intermediate period between the output period To and the reset period $T_R$, the sixth switching device Tr6 of the second stage ST2 supplies the first discharging voltage VSS1 to the output terminal OT of the second stage ST2 in response to the third scan pulse SP3 from the third stage ST3. As a result, the output terminal OT of the second stage ST2 is maintained at a voltage of a middle state in the intermediate period and, thereafter, at the first discharging voltage VSS1 in the reset period $T_R$.

On the other hand, in this reset period $T_R$, the voltage at the first preset node PN1, the voltage at the second preset node PN2, the voltage at the set node Q and the voltage at the output terminal OT are periodically discharged respectively by the first scan pulse SP1 of the low state, the second discharging voltage VSS2, the second discharging voltage VSS2 and the first discharging voltage VSS1 based on the periodically supplied second clock pulse CLK2 of the high state, so that stability of the circuit can be secured.

The other components of the sixth embodiment, not described, are the same as those of the first embodiment, stated above. For example, the first and second charging voltages VDD1 and VDD2 and the first and second discharging voltages VSS1 and VSS2 in the sixth embodiment have the same characteristics as those in the first embodiment.

Figure 10:
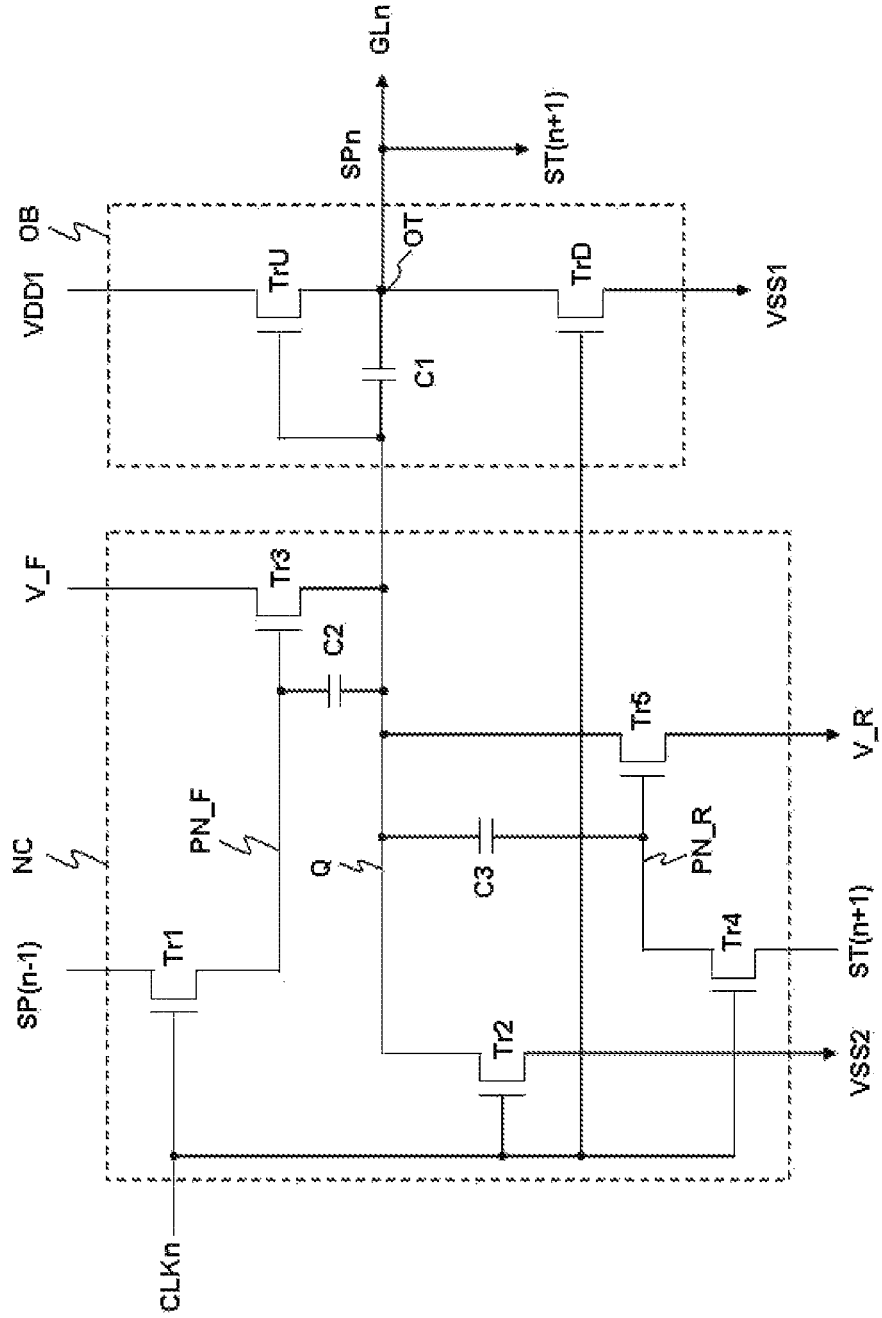
FIG. 10 is a circuit diagram of an arbitrary nth stage according to a seventh embodiment of the present invention.
Figure 11:
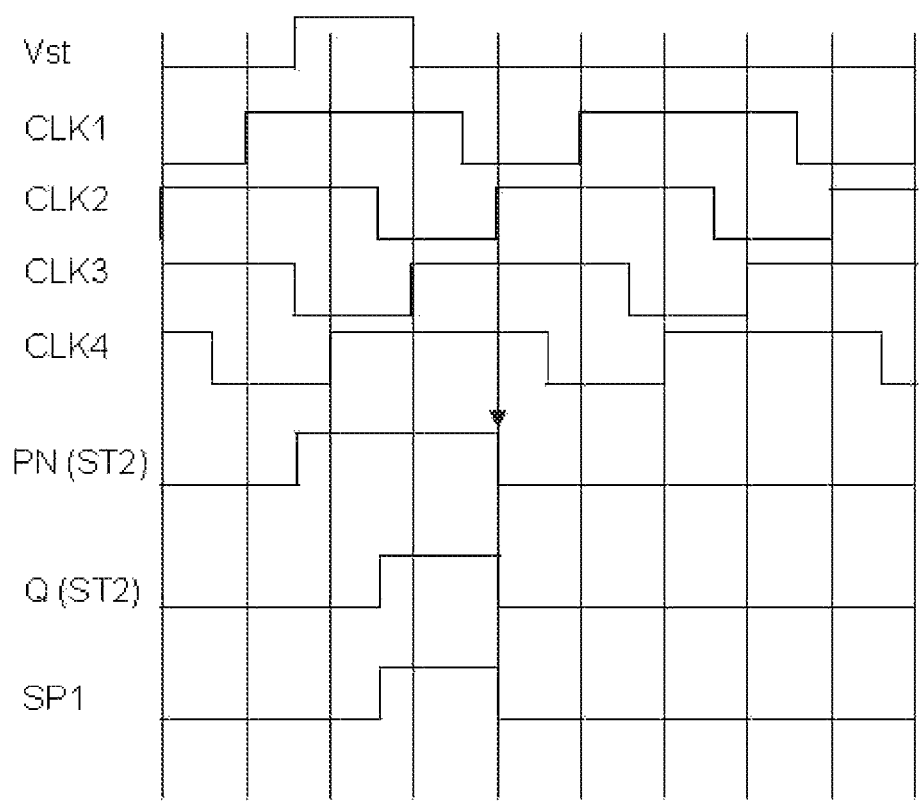
FIG. 11 is a timing diagram of clock pulses used in reverse driving.

FIG. 10 is a circuit diagram of an arbitrary nth stage according to a seventh embodiment of the present invention, and FIG. 11 is a timing diagram of clock pulses used in reverse driving.

In forward driving, the stages according to this seventh embodiment are supplied with the clock pulses CLK1 to CLK4 as shown in FIG. 2 (referred to hereinafter as forward clock pulses). In contrast, in reverse driving, the stages according to this seventh embodiment are supplied with the clock pulses CLK1 to CLK4 as shown in FIG. 11 (referred to hereinafter as reverse clock pulses).

The shift register including the stages according to the seventh embodiment of the present invention may output scan pulses forward and reversely. That is, in the forward driving, the m stages ST1 to STm of the shift register output the scan pulses SP1 to SPm sequentially from the first stage ST1 to the last stage STm. In contrast, in the reverse driving, the m stages ST1 to STm of the shift register output the scan pulses SP1 to SPm sequentially from the last stage STm to the first stage ST1.

Each stage according to the seventh embodiment of the present invention includes, as shown in FIG. 10, a node controller NC for controlling a charging duration of a set node Q, an output unit OB for outputting a corresponding scan pulse through an output terminal OT for the charging duration of the set node Q, and first to third capacitors C1 to C3.

The first capacitor C1 is connected between the set node Q and the output terminal OT, the second capacitor C2 is connected between a forward preset node PN_F and the set node Q, and the third capacitor C3 is connected between the set node Q and a reverse preset node PN_R.

The node controller NC maintains the charging duration for a time corresponding to a low duration of any one of the plurality of clock pulses CLK1 to CLK4 having phase differences therebetween.

The output unit OB outputs the scan pulse of a high state for the charging duration by outputting the first charging voltage VDD1 for the charging duration.

To this end, the output unit OB and the node controller NC have configurations as follows.

The output unit OB of the nth stage includes a pull-up switching device TrU and a pull-down switching device TrD.

The pull-up switching device TrU is controlled by a voltage at the set node Q and is connected between a first charging voltage line which transfers the first charging voltage VDD1 and the output terminal OT of the nth stage.

The pull-down switching device TrD is controlled by any one of the clock pulses CLK1 to CLK4 and is connected between the output terminal OT of the nth stage and a first discharging voltage line which transfers the first discharging voltage VSS1. For example, the pull-down switching device TrD of the (4n+1)th stage may be controlled by the first clock pulse CLK1, the pull-down switching device TrD of the (4n+2)th stage may be controlled by the second clock pulse CLK2, the pull-down switching device TrD of the (4n+3)th stage may be controlled by the third clock pulse CLK3, and the pull-down switching device TrD of the (4n+4)th stage may be controlled by the fourth clock pulse CLK4.

The node controller NC of the nth stage (where n is a natural number) includes first to fifth switching devices Tr1 to Tr5.

The first switching device Tr1 is controlled by any one of the clock pulses CLK1 to CLK4 and is connected between the output terminal OT of an (n−p)th stage (where p is a natural number less than n) and the forward preset node PN_F. For example, the first switching device Tr1 of the second stage ST2 may be controlled by the second clock pulse CLK2 and be connected between the output terminal OT of the first stage ST1 and the forward preset node PN_F of the second stage ST2.

The second switching device Tr2 is controlled by any one of the clock pulses CLK1 to CLK4 and is connected between the set node Q and a second discharging voltage line which transfers the second discharging voltage VSS2. For example, the second switching device Tr2 of the second stage ST2 may be controlled by the second clock pulse CLK2 and be connected between the set node Q and the second discharging voltage line.

The third switching device Tr3 is controlled by a voltage at the forward preset node PN_F and is connected between a forward voltage line which transfers a forward voltage V_F and the set node Q. Here, the forward voltage V_F is kept high in the forward driving, whereas low in the reverse driving. The high voltage of the forward voltage V_F may be the same as the above first charging voltage VDD1 or second charging voltage VDD2. Also, the low voltage of the forward voltage V_F may be the same as the above first discharging voltage VSS1 or second discharging voltage VSS2.

The fourth switching device Tr4 is controlled by any one of the clock pulses CLK1 to CLK4 and is connected between the output terminal OT of an (n+q)th stage (where q is a natural number) and the reverse preset node PN_R. For example, the fourth switching device Tr4 of the second stage ST2 may be controlled by the second clock pulse CLK2 and be connected between the output terminal OT of the third stage ST1 and the reverse preset node PN_R of the second stage ST2.

The fifth switching device Tr5 is controlled by a voltage at the reverse preset node PN_R and is connected between a reverse voltage line which transfers a reverse voltage V_R and the set node Q. Here, the reverse voltage V_R is kept high in the reverse driving, whereas low in the forward driving. The high voltage of the reverse voltage V_R may be the same as the above first charging voltage VDD1 or second charging voltage VDD2. Also, the low voltage of the reverse voltage V_R may be the same as the above first discharging voltage VSS1 or second discharging voltage VSS2.

Here, the first switching device Tr1, the second switching device Tr2, the fourth switching device Tr4 and the pull-down switching device TrD are all supplied with the same clock pulse.

The low duration of the clock pulse supplied to the first switching device Tr1, second switching device Tr2, fourth switching device Tr4 and pull-down switching device TrD coincides with the high duration of the scan pulse output from the nth stage.

In the forward driving, the high duration of the clock pulse (forward clock pulse) supplied to the first switching device Tr1, second switching device Tr2, fourth switching device Tr4 and pull-down switching device TrD partially overlaps with the high duration of a scan pulse from the (n−p)th stage. For example, the clock pulse supplied to the first switching device Tr1, second switching device Tr2, fourth switching device Tr4 and pull-down switching device TrD of the second stage ST2 may be the second clock pulse CLK2 (second forward clock pulse), the high duration of which may partially overlap with the high duration of the first scan pulse SP1 output from the first stage ST1, as shown in FIG. 2.

Also, in the reverse driving, the high duration of the clock pulse (reverse clock pulse) supplied to the first switching device Tr1, second switching device Tr2, fourth switching device Tr4 and pull-down switching device TrD partially overlaps with the high duration of a scan pulse from the (n+q)th stage.

On the other hand, the forward voltage V_F and reverse voltage V_R supplied to the shift register including these stages may have relationships as follows.

For example, in the forward driving, the forward voltage V_F may be higher than or equal to the first charging voltage VDD1. In this case, the reverse voltage V_R may be the same as the second discharging voltage VSS2.

In contrast, in the reverse driving, the reverse voltage V_R may be higher than or equal to the first charging voltage VDD1. In this case, the forward voltage V_F may be the same as the second discharging voltage VSS2.

In the forward driving, any one of the forward clock pulses CLK1 to CLK4 as shown in FIG. 2 is supplied to the first switching device Tr1, second switching device Tr2, fourth switching device Tr4 and pull-down switching device TrD. In contrast, in the reverse driving, any one of the reverse clock pulses CLK1 to CLK4 as shown in FIG. 11 is supplied to the first switching device Tr1, second switching device Tr2, fourth switching device Tr4 and pull-down switching device TrD.

The reverse clock pulses CLK1 to CLK4 are output in such a manner that the fourth clock pulse CLK4 is output first and the third clock pulse CLK3, second clock pulse CLK2 and first clock pulse CLK1 are then output in order, as shown in FIG. 11.

The other components of the seventh embodiment, not described, are the same as those of the first embodiment, stated above. For example, the first and second charging voltages VDD1 and VDD2 and the first and second discharging voltages VSS1 and VSS2 in the seventh embodiment have the same characteristics as those in the first embodiment.

Figure 12:
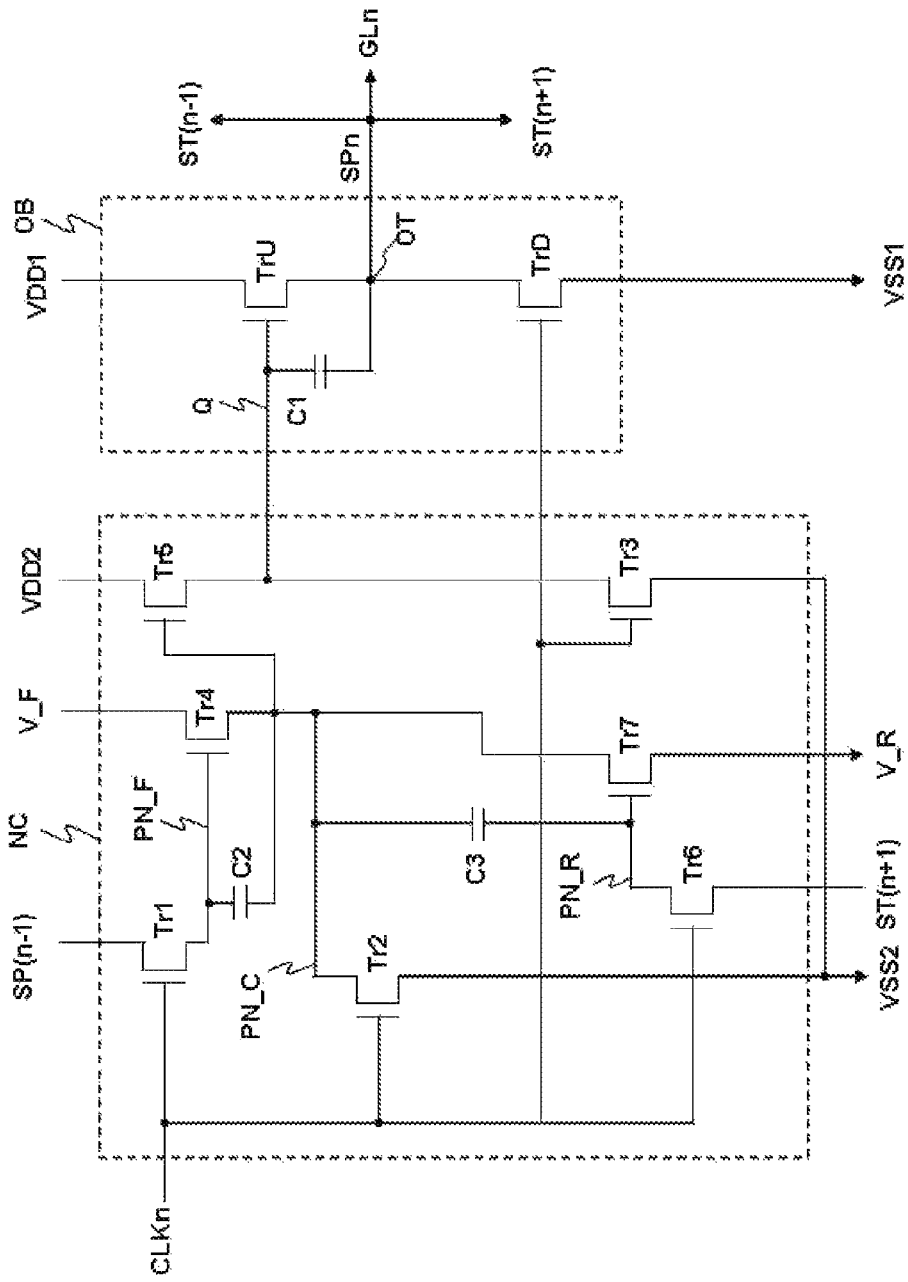
FIG. 12 is a circuit diagram of an arbitrary nth stage according to an eighth embodiment of the present invention.

FIG. 12 is a circuit diagram of an arbitrary nth stage according to an eighth embodiment of the present invention. In forward driving, the stages according to this eighth embodiment are supplied with the forward clock pulses CLK1 to CLK4 as shown in FIG. 2. In contrast, in reverse driving, the stages according to this eighth embodiment are supplied with the reverse clock pulses CLK1 to CLK4 as shown in FIG. 11.

The shift register including the stages according to the eighth embodiment of the present invention may output scan pulses forward and reversely in the same manner as in the above seventh embodiment.

Each stage according to the eighth embodiment of the present invention includes, as shown in FIG. 12, a node controller NC for controlling a charging duration of a set node Q, an output unit OB for outputting a corresponding scan pulse through an output terminal OT for the charging duration of the set node Q, and first to third capacitors C1 to C3.

The first capacitor C1 is connected between the set node Q and the output terminal OT, the second capacitor C2 is connected between a forward preset node PN_F and a common preset node PN_C, and the third capacitor C3 is connected between the common preset node PN_C and a reverse preset node PN_R.

The node controller NC maintains the charging duration for a time corresponding to a low duration of any one of the plurality of clock pulses CLK1 to CLK4 having phase differences therebetween.

The output unit OB outputs the scan pulse of a high state for the charging duration by outputting the first charging voltage VDD1 for the charging duration.

To this end, the output unit OB and the node controller NC have configurations as follows.

The output unit OB of the nth stage includes a pull-up switching device TrU and a pull-down switching device TrD.

The pull-up switching device TrU is controlled by a voltage at the set node Q and is connected between a first charging voltage line which transfers the first charging voltage VDD1 and the output terminal OT of the nth stage.

The pull-down switching device TrD is controlled by any one of the clock pulses CLK1 to CLK4 and is connected between the output terminal OT of the nth stage and a first discharging voltage line which transfers the first discharging voltage VSS1. For example, the pull-down switching device TrD of the (4n+1)th stage may be controlled by the first clock pulse CLK1, the pull-down switching device TrD of the (4n+2)th stage may be controlled by the second clock pulse CLK2, the pull-down switching device TrD of the (4n+3)th stage may be controlled by the third clock pulse CLK3, and the pull-down switching device TrD of the (4n+4)th stage may be controlled by the fourth clock pulse CLK4.

The node controller NC of the nth stage (where n is a natural number) includes first to seventh switching devices Tr1 to Tr7.

The first switching device Tr1 is controlled by any one of the clock pulses CLK1 to CLK4 and is connected between the output terminal OT of an (n−p)th stage (where p is a natural number less than n) and the forward preset node PN_F. For example, the first switching device Tr1 of the second stage ST2 may be controlled by the second clock pulse CLK2 and be connected between the output terminal OT of the first stage ST1 and the forward preset node PN_F of the second stage ST2.

The second switching device Tr2 is controlled by any one of the clock pulses CLK1 to CLK4 and is connected between the common preset node PN_C and a second discharging voltage line which transfers the second discharging voltage VSS2. For example, the second switching device Tr2 of the second stage ST2 may be controlled by the second clock pulse CLK2.

The third switching device Tr3 is controlled by any one of the clock pulses CLK1 to CLK4 and is connected between the set node Q and the second discharging voltage line. For example, the third switching device Tr3 of the second stage ST2 may be controlled by the second clock pulse CLK2.

The fourth switching device Tr4 is controlled by a voltage at the forward preset node PN_F and is connected between a forward voltage line which transfers a forward voltage V_F and the common preset node PN_C. Here, the forward voltage V_F is kept high in the forward driving, whereas low in the reverse driving. The high voltage of the forward voltage V_F may be the same as the above first charging voltage VDD1 or second charging voltage VDD2. Also, the low voltage of the forward voltage V_F may be the same as the above first discharging voltage VSS1 or second discharging voltage VSS2.

The fifth switching device Tr5 is controlled by a voltage at the common preset node PN_C and is connected between a second charging voltage line which transfers the second charging voltage VDD2 and the set node Q.

The sixth switching device Tr6 is controlled by any one of the clock pulses CLK1 to CLK4 and is connected between the output terminal OT of an (n+q)th stage (where q is a natural number) and the reverse preset node PN_R. For example, the sixth switching device Tr6 of the second stage ST2 may be controlled by the second clock pulse CLK2 and be connected between the output terminal OT of the third stage ST1 and the reverse preset node PN_R of the second stage ST2.

The seventh switching device Tr7 is controlled by a voltage at the reverse preset node PN_R and is connected between a reverse voltage line which transfers a reverse voltage V_R and the common preset node PN_C. Here, the reverse voltage V_R is kept high in the reverse driving, whereas low in the forward driving. The high voltage of the reverse voltage V_R may be the same as the above first charging voltage VDD1 or second charging voltage VDD2. Also, the low voltage of the reverse voltage V_R may be the same as the above first discharging voltage VSS1 or second discharging voltage VSS2.

Here, the first switching device Tr1, the second switching device Tr2, the third switching device Tr3, the sixth switching device Tr6 and the pull-down switching device TrD are all supplied with the same clock pulse.

The low duration of the clock pulse supplied to the first switching device Tr1, second switching device Tr2, third switching device Tr3, sixth switching device Tr6 and pull-down switching device TrD coincides with the high duration of the scan pulse output from the nth stage.

In the forward driving, the high duration of the clock pulse (forward clock pulse) supplied to the first switching device Tr1, second switching device Tr2, third switching device Tr3, sixth switching device Tr6 and pull-down switching device TrD partially overlaps with the high duration of a scan pulse from the (n−p)th stage. For example, the clock pulse supplied to the first switching device Tr1, second switching device Tr2, third switching device Tr3, sixth switching device Tr6 and pull-down switching device TrD of the second stage ST2 may be the second clock pulse CLK2 (second forward clock pulse), the high duration of which may partially overlap with the high duration of the first scan pulse SP1 output from the first stage ST1, as shown in FIG. 2.

Also, in the reverse driving, the high duration of the clock pulse (reverse clock pulse) supplied to the first switching device Tr1, second switching device Tr2, third switching device Tr3, sixth switching device Tr6 and pull-down switching device TrD partially overlaps with the high duration of a scan pulse from the (n+q)th stage.

On the other hand, the forward voltage V_F and reverse voltage V_R supplied to the shift register including these stages may have relationships as follows.

For example, in the forward driving, the forward voltage V_F may be higher than or equal to the first charging voltage VDD1. In this case, the reverse voltage V_R may be the same as the second discharging voltage VSS2.

In contrast, in the reverse driving, the reverse voltage V_R may be higher than or equal to the first charging voltage VDD1. In this case, the forward voltage V_F may be the same as the second discharging voltage VSS2.

Figure 13:
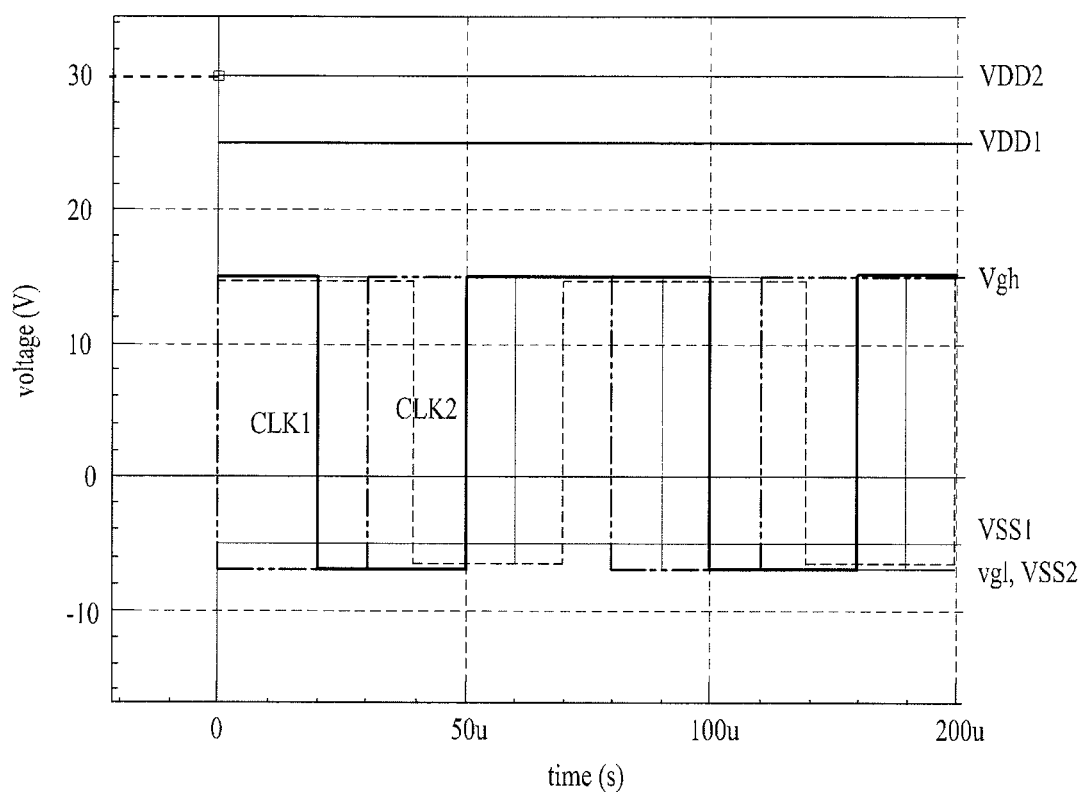
FIG. 13 is a simulated waveform diagram illustrating relationships among various signals which are supplied to the shift register of FIG. 1.

FIG. 13 is a simulated waveform diagram illustrating relationships among various signals which are supplied to the shift register of FIG. 1.

According to FIG. 13, the second charging voltage VDD2 is highest, the first charging voltage VDD1 is next high, the high voltage Vgh of the clock pulse is next high, the first discharging voltage VSS1 is next high and the second discharging voltage VSS2 is lowest. Here, the low voltage Vgl of the clock pulse is the same as the second discharging voltage VSS2.

Figure 14:
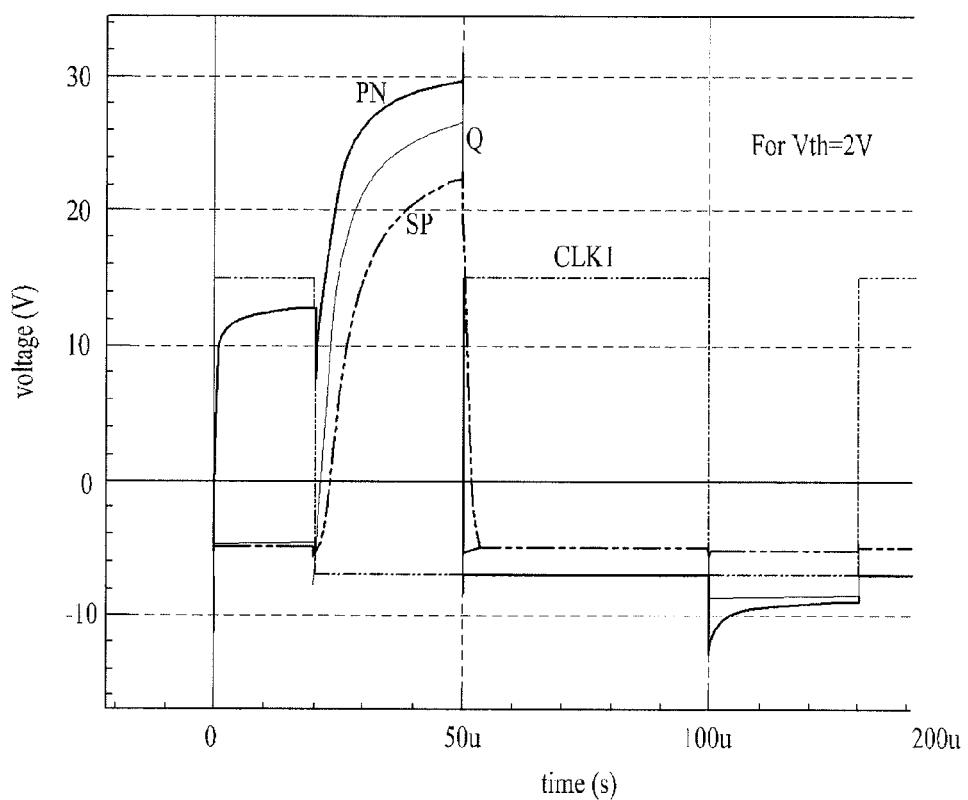
FIG. 14 is a simulated waveform diagram illustrating relationships among a voltage at a preset node, a voltage at a set node and a voltage of a scan pulse in the present invention.

FIG. 14 is a simulated waveform diagram illustrating relationships among a voltage at a preset node, a voltage at a set node and a voltage of a scan pulse in the present invention.

When the threshold voltage Vth of the second switching device Tr2 in the first embodiment is 2V, the voltage at the preset node PN, the voltage at the set node Q and the voltage of the scan pulse SP are set as shown in FIG. 14.

Figure 15:
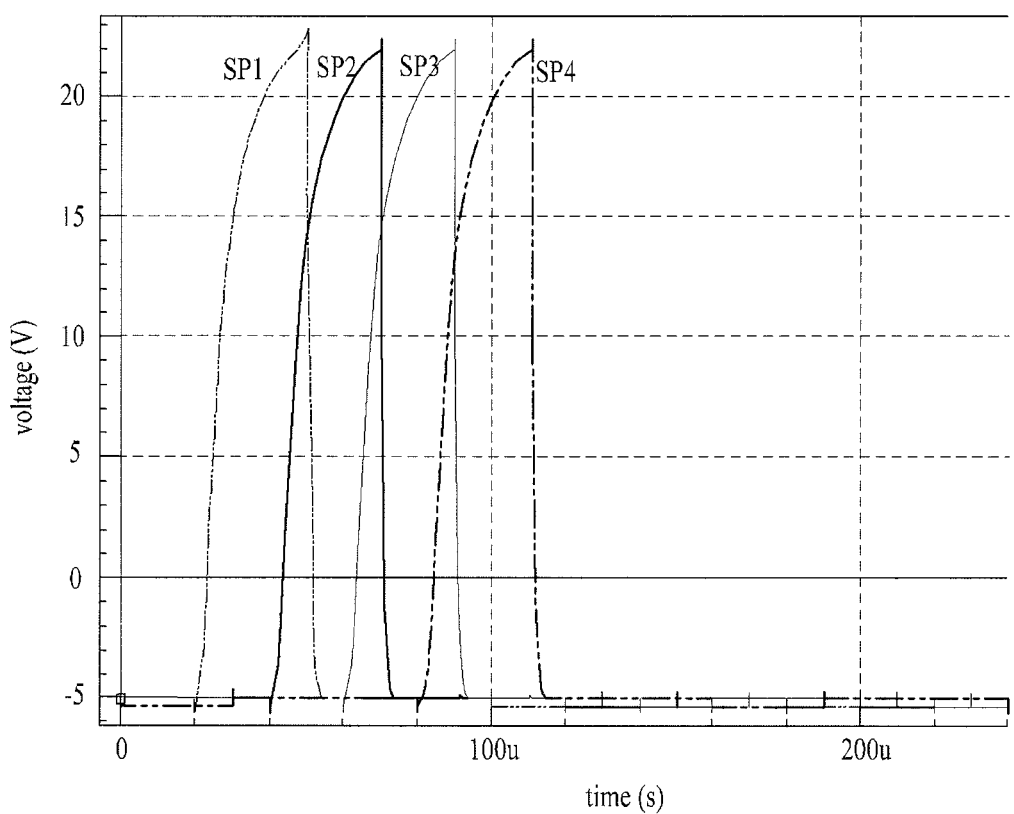
FIG. 15 is a simulated waveform diagram of first to fourth scan pulses in the present invention.

FIG. 15 is a simulated waveform diagram of first to fourth scan pulses in the present invention.

As can be seen from FIG. 15, the first to fourth scan pulses are sequentially output while overlapping.

Figure 16:
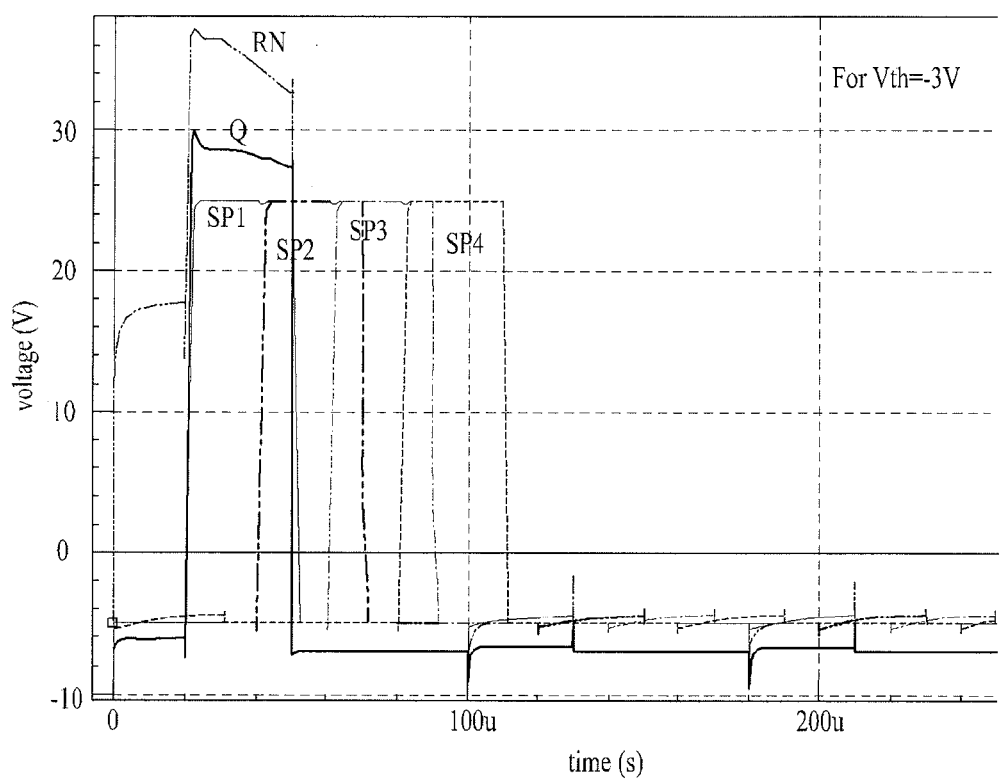
FIG. 16 is a simulated waveform diagram of a voltage at a preset node, a voltage at a set node and first to fourth scan pulses in the present invention.

FIG. 16 is a simulated waveform diagram of a voltage at a preset node, a voltage at a set node and first to fourth scan pulses in the present invention.

When the threshold voltage Vth of the second switching device Tr2 in the first embodiment is −3V, the voltage at the preset node PN, the voltage at the set node Q and the voltage of the scan pulse SP are set as shown in FIG. 16.

On the other hand, in all of the embodiments, when voltages to be compared with each other have the same polarity, the comparison is made based on, not the absolute values of the levels of the voltages, but the levels themselves. For example, the low voltage of the clock pulse CLKn and the second discharging voltage VSS2 in FIG. 3 may both be negative. In this case, that the low voltage of the clock pulse CLKn is lower than the second discharging voltage VSS2 means that the second discharging voltage VSS2 is, for example, −5V if the low voltage of the clock pulse CLKn is, for example, −10V.

As is apparent from the above description, a shift register according to the present invention has effects as follows.

Firstly, a scan pulse is generated using a DC voltage to remove a coupling phenomenon, thereby stabilizing the output of the shift register.

Secondly, a DC voltage is used instead of a clock pulse, thereby reducing power consumption compared with conventional cases.

Thirdly, the levels of discharging voltages supplied to the gate electrode and source electrode of a switching device which is in charge of discharging of a set node are set in such a manner that the discharging voltage supplied to the gate electrode is kept lower than the discharging voltage supplied to the source electrode, thereby completely turning off the switching device in an output period, so as to normally generate a scan pulse.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising a plurality of stages for sequentially outputting scan pulses in such a manner that high durations of the scan pulses partially overlap with each other, wherein each of the stages comprises:
 a node controller configured to control a charging duration of a set node; and
 an output unit configured to output a corresponding one of the scan pulses through an output terminal for the charging duration of the set node,
 wherein:
 the node controller maintains the charging duration for a time corresponding to a low duration of any one of a plurality of clock pulses having phase differences therebetween; and
 the output unit outputs the corresponding scan pulse of a high state for the charging duration by selectively outputting a first charging voltage for the charging duration, the first charging voltage being a direct current (DC) voltage,
 wherein the plurality of clock pulses are sequentially output in such a manner that low durations thereof partially overlap with each other,
 wherein the output unit comprises a pull-up switching device controlled by a voltage at the set node and connected between a first charging voltage line transferring the first charging voltage and the output terminal,
 wherein the output unit further comprises a pull-down switching device controlled by any one of the clock pulses and connected between the output terminal and a first discharging voltage line transferring a first discharging voltage,
 wherein the node controller of an nth one of the stages (where n is a natural number) comprises:
 a first switching device controlled by any one of the clock pulses and connected between the output terminal of an (n−p)th one of the stages (where p is a natural number less than n) and a first preset node;
 a second switching device controlled by any one of the clock pulses and connected between a second preset node and a second discharging voltage line transferring a second discharging voltage;
 a third switching device controlled by any one of the clock pulses and connected between the set node and the second discharging voltage line;
 a fourth switching device controlled by a voltage at the first preset node and connected between a third charging voltage line transferring a third charging voltage and the second preset node; and
 a fifth switching device controlled by a voltage at the second preset node and connected between a second charging voltage line transferring a second charging voltage and the set node,
 wherein the first switching device, the second switching device, the third switching device and the pull-down switching device are all supplied with the same clock pulse,
 wherein the clock pulse supplied to the first switching device, the second switching device, the third switching device and the pull-down switching device has a low duration coinciding with a high duration of a scan pulse output from the nth stage, and
 wherein the clock pulse supplied to the first switching device, the second switching device, the third switching device and the pull-down switching device has a high duration partially overlapping with a high duration of a scan pulse from the (n−p)th stage.

2. The shift register according to claim 1, wherein the nth stage further comprises:
 a first capacitor connected between the set node and the output terminal; and
 a second capacitor connected between the first preset node and the second preset node.

3. The shift register according to claim 1, wherein the third charging voltage is the same as any one of the first charging voltage and the second charging voltage.

4. The shift register according to claim 1, wherein the node controller of the nth stage further comprises a sixth switching device controlled by a scan pulse from an (n+q)th stage (where q is a natural number) and connected between the output terminal of the nth stage and the first discharging voltage line.

* * * * *